United States Patent
Liang et al.

(10) Patent No.: US 9,373,742 B2
(45) Date of Patent: Jun. 21, 2016

(54) PLASMA-ASSISTED TECHNIQUES FOR FABRICATING SEMICONDUCTOR DEVICES

(71) Applicant: The Regents of The University of Michigan, Ann Arbor, MI (US)

(72) Inventors: Xiaogan Liang, Ann Arbor, MI (US); Hongsuk Nam, Ann Arbor, MI (US); Sungjin Wi, Ann Arbor, MI (US); Mikai Chen, Ann Arbor, MI (US)

(73) Assignee: The Regents Of The University Of Michigan, Ann Arbor, MI (US)

( * ) Notice: Subject to any disclaimer, the term of this patent is extended or adjusted under 35 U.S.C. 154(b) by 0 days.

(21) Appl. No.: 14/640,194

(22) Filed: Mar. 6, 2015

(65) Prior Publication Data

US 2015/0255661 A1    Sep. 10, 2015

Related U.S. Application Data

(60) Provisional application No. 61/948,633, filed on Mar. 6, 2014.

(51) Int. Cl.
| | |
|---|---|
| H01L 31/18 | (2006.01) |
| H01L 31/032 | (2006.01) |
| H01L 21/467 | (2006.01) |
| B29C 59/02 | (2006.01) |
| H01L 29/16 | (2006.01) |

(52) U.S. Cl.
CPC .............. H01L 31/18 (2013.01); B29C 59/02 (2013.01); H01L 21/467 (2013.01); H01L 29/1606 (2013.01); H01L 31/032 (2013.01); H01L 31/1884 (2013.01); Y02P 70/521 (2015.11)

(58) Field of Classification Search
CPC ..... B29C 59/02; H01L 29/1606; H01L 31/18; H01L 31/1896; H01L 31/186; H01L 31/1892; H01L 21/465; H01L 21/467
See application file for complete search history.

(56) References Cited

U.S. PATENT DOCUMENTS

| | | | | |
|---|---|---|---|---|
| 4,571,448 A | * | 2/1986 | Barnett | H01L 31/1804 136/256 |
| 8,057,863 B2 | | 11/2011 | Liang | |
| 9,240,478 B2 | * | 1/2016 | Chang | H01L 29/7827 |
| 2003/0054663 A1 | * | 3/2003 | Stanbery | H01L 31/0322 438/765 |
| 2006/0038182 A1 | * | 2/2006 | Rogers | B82Y 10/00 257/77 |
| 2008/0179547 A1 | * | 7/2008 | Henley | H01L 21/76254 250/492.21 |
| 2009/0181492 A1 | * | 7/2009 | Nunan | H01L 21/76254 438/97 |

(Continued)

OTHER PUBLICATIONS

Nam, H. "MoS2 Transistors Fabricated via Plasma-Assisted Nanoprinting of Few-Layer MoS2 Flakes into Large-Area Arrays" ACSNano vol. 7, No. 7 Jun. 22, 2013 pp. 5870-5881.*

(Continued)

*Primary Examiner* — Matthew Landau
*Assistant Examiner* — Grant Withers
(74) *Attorney, Agent, or Firm* — Harness, Dickey & Pierce, PLC

(57) ABSTRACT

Plasma-assisted techniques are provided for fabricating semiconductor devices. In one aspect, a plasma is applied to a substrate before exfoliating layers of a multi-layer structure of atomically thin two-dimensional sheets onto the substrate. The exfoliated layers serve as the basis for constructing a semiconductor device. In another aspect, a p-n junction is formed by applying a plasma to top layers of a multi-layer structure of atomically thin two-dimensional sheets and then exfoliating a portion of the multi-layer structure onto a bottom electrode.

9 Claims, 21 Drawing Sheets

(56) References Cited

U.S. PATENT DOCUMENTS

| | | | | |
|---|---|---|---|---|
| 2009/0194153 | A1* | 8/2009 | Hilali | H01L 31/022425 136/255 |
| 2009/0200707 | A1* | 8/2009 | Kivioja | B82Y 10/00 264/293 |
| 2010/0009541 | A1* | 1/2010 | Chou | B81C 1/00031 438/694 |
| 2010/0081282 | A1* | 4/2010 | Chou | H01L 21/0273 438/694 |
| 2010/0140219 | A1* | 6/2010 | Liang | B82Y 30/00 216/41 |
| 2011/0121258 | A1* | 5/2011 | Hanein | B82Y 10/00 257/9 |
| 2011/0277813 | A1* | 11/2011 | Rogers | H01L 31/035281 136/244 |
| 2012/0315482 | A1* | 12/2012 | Muramatsu | C01B 31/04 428/402 |
| 2013/0009825 | A1* | 1/2013 | Lee | B82Y 10/00 343/700 MS |
| 2013/0287881 | A1* | 10/2013 | Iyama | B29C 33/42 425/385 |
| 2013/0288463 | A1* | 10/2013 | Winkler | H01L 31/03682 438/487 |
| 2014/0206192 | A1* | 7/2014 | Yeom | H01L 21/042 438/694 |
| 2014/0319655 | A1* | 10/2014 | Sparta | H01L 21/7624 257/613 |
| 2015/0076450 | A1* | 3/2015 | Weman | B82Y 10/00 257/29 |
| 2015/0170906 | A1* | 6/2015 | Redepenning | H01L 21/02118 257/29 |
| 2015/0294875 | A1* | 10/2015 | Khondaker | H01L 21/02175 257/411 |
| 2015/0299852 | A1* | 10/2015 | Ozkan | H01G 4/008 136/255 |

OTHER PUBLICATIONS

Chen, M "Nanoimprint-Assisted Shear Exfoliation (NASE) for Producing Mutlilayer $MoS_2$ Structures as Field-Effect Transistor Channel Arrays" ACSNano vol. 9, No. 9 Aug. 24, 2015 pp. 8773-8785.*

Du, Y "Molecular Doping of Multilayer $MoS_2$ Field-Effect Transistors: Reduction in Sheet and Contact Resistances" IEEE Elec. Dev. Lett. vol. 34 No. 10 pp. 1328-1330 Oct. 2013.*

Fang, H "Degenerate n-Doping of Few-Layer Transistion Metal Dichalcogenides by Potassium" ACS Nano Lett. 13 Apr. 9, 2013 pp. 1991-1995.*

Khalil, H. "Highly Stable and Tunable Chemical Doping of Multilayer $WS_2$ Field Effect Transistor: Reduction in Contact Resistance" ACS Appl. Mater. Interfaces 2015, 7, pp. 23589-23596 Oct. 5, 2015.*

Suh, J. "Doping against the Native Propensity of $MoS_2$: Degenerate Hole Doping by Cation Substitution" Nano Lett. 2014, 14 pp. 6976-6982 Nov. 24, 2014.*

Arthur, Samuel "Photovoltaic Devices Made from Plasma-Doped Two-Dimensional Layered Semiconductors" Published on the NNIN website at http://www.nnin.org/reu/past-years/2014-nnin-reu-program as of Sep. 7, 2015 and appears to have been presented at a conference as of Aug. 13, 2014.*

* cited by examiner

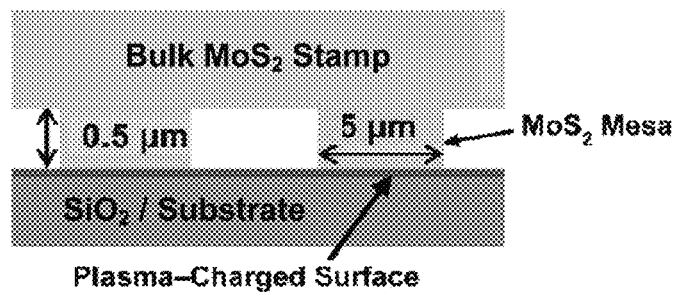
FIG. 5A
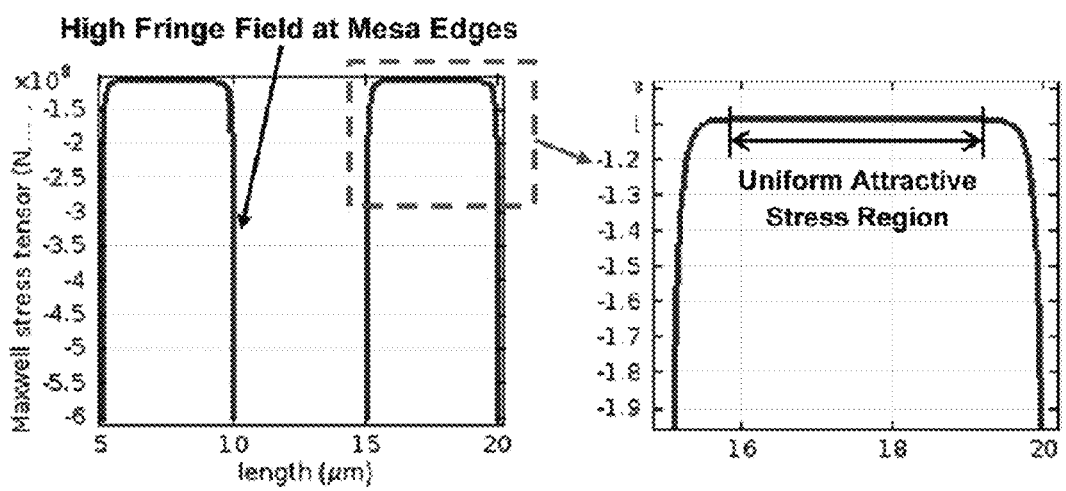
FIG. 5B                    FIG. 5C

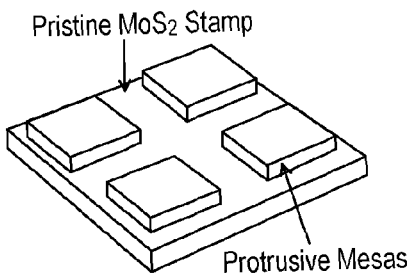
FIG. 12A
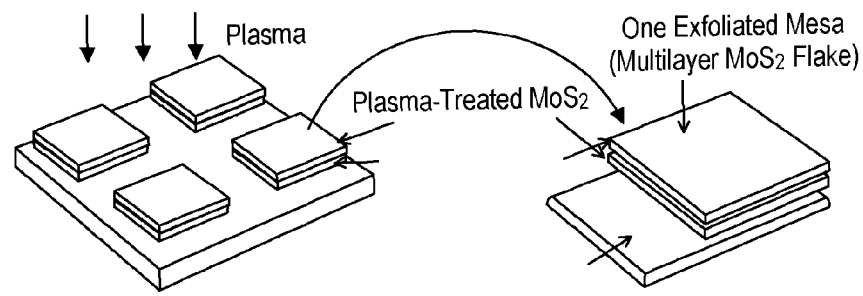
FIG. 12B  FIG. 12C
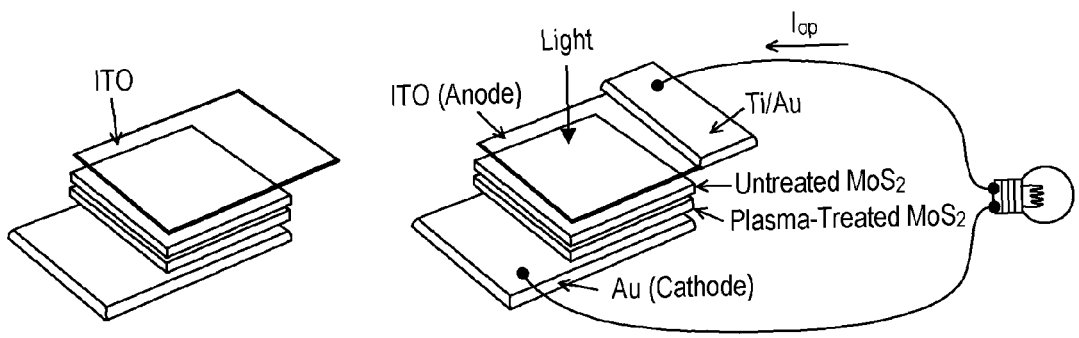
FIG. 12D  FIG. 12E

PLASMA-ASSISTED TECHNIQUES FOR FABRICATING SEMICONDUCTOR DEVICES

CROSS-REFERENCE TO RELATED APPLICATIONS

This application claims the benefit of U.S. Provisional Application No. 61/948,633 filed on Mar. 6, 2014. The entire disclosure of the above application is incorporated herein by reference.

GOVERNMENT INTEREST

This invention was made with government support under CMMI1232883 awarded by the National Science Foundation. The Government has certain rights in the invention.

FIELD

The present disclosure relates to plasma-assisted techniques for fabricating semiconductor devices.

BACKGROUND

Molybdenum disulfide ($MoS_2$) belongs to the family of the layered transition metal dichalcogenides (LTMDs). It has been widely used as a dry lubricant and as a catalyst for desulfurization in petroleum refineries. Recently, $MoS_2$ attracted a great deal of attention because of its attractive electronic, optoelectronic, and mechanical properties. In the bulk form, $MoS_2$ is an indirect bandgap semiconductor with an energy gap of ~1.2 eV. In the monolayer form, MoS2 has a large direct bandgap (~1.8 eV). Therefore, $MoS_2$ can serve as an important complement to zero-bandgap graphene and enable new semiconductor-related applications of two-dimensional (2-D) materials such as thin-film transistors (TFTs), phototransistors, chemical sensors, integrated circuits (ICs), and thin-film light-emitting diodes (LEDs). As a 2-D nanoelectronic material, $MoS_2$ is advantageous over bulk Si for suppressing the undesirable tunneling between drain and source regions at the scaling limit of transistors and therefore provides benefits for miniaturization of electronic devices beyond Moore's Law. In addition, bulk (or multi-layer) $MoS_2$ exhibits relatively high in-plane carrier mobility comparable to that of crystalline Si, as well as robust mechanical and chemical properties, which makes it an attractive material for making flexible electronic devices with high performance and long lifetime.

A broad variety of prototype devices based on few-layer $MoS_2$, such as high-performance field effect transistors (FETs), phototransistors, sensors, and integrated circuits (ICs), have been fabricated and extensively studied in research laboratories. However, the scale-up applications of $MoS_2$, especially the mass production of commercially viable products, demand large arrays of orderly arranged $MoS_2$ structures. This requirement breaks down into two critical challenges in nanomanufacturing, which are (1) incorporating pristine $MoS_2$ films over large areas and (2) patterning $MoS_2$ into ordered micro- and nanostructures over large areas to obtain both desirable electronic properties and required functionality. Several approaches have been attempted to produce $MoS_2$ materials for large area applications, including scotch tape exfoliation, liquid phase exfoliation in an organic solvent, intercalation followed with forced hydration, transition metal sulfurization, thermal decomposition of thiosalts, chemical vapor deposition (CVD), and van der Waals epitaxial growth, etc. So far, a few efforts have been invested to the lithographic patterning of $MoS_2$ sheets and the deposition of $MoS_2$ crystals into ordered arrays. All of these technologies for producing $MoS_2$ structures still suffer from one or more obstacles that prevent the creation of ordered, pristine $MoS_2$ device arrays over large areas. Obviously, an upscalable nanomanufacturing technology capable of producing ordered and pristine few-layer $MoS_2$ patterns would have a transformative impact on future manufacturing of $MoS_2$ electronic and optoelectronic devices and systems.

This section provides background information related to the present disclosure which is not necessarily prior art.

SUMMARY

This section provides a general summary of the disclosure, and is not a comprehensive disclosure of its full scope or all of its features.

In one aspect of this disclosure, a plasma-assisted method is provided for fabricating a semiconductor device. The method includes: forming one or more protrusions on a top surface of a plate using lithographic techniques, where the plate is a multi-layer structure of atomically thin two-dimensional sheets; exfoliating layers of the protrusions from the top surface of the plate by pressing the top surface of the plate against a planar surface of a substrate; applying a plasma to the planar surface of the substrate before the step of exfoliating; and constructing a semiconductor device in part from the exfoliated layers of protrusions on the planar surface of the substrate. Prior to forming the one or more protrusions, the plate may be attached to a flexible tape.

Forming the one or more protrusions may be achieved by applying a photoresist layer on the top surface of the plate; depositing a metal mask onto the top surface of the plate; plasma etching the top surface of the plate to form the one or more protrusions; and removing the metal mask from the one or more protrusions.

Plasma can be applied, for example using reactive ion etching. In some embodiment, the plasma contains one of oxygen or flouride.

In another aspect of this disclosure, a plasma-assisted method is provided for fabricating a p-n junction of a semiconductor device. The method includes: forming one or more protrusions on a top surface of an ingot using lithographic techniques, where the ingot is a multi-layer structure of atomically thin two-dimensional sheets; doping the one or more protrusions by applying a plasma thereto; and exfoliating layers of a given protrusion from the top surface of the ingot by pressing the top surface of the ingot against a planar surface of a bottom electrode. The method further includes forming a top electrode of the semiconductor device by depositing a transparent material onto the exfoliated layers of the given protrusion.

In some embodiments, each sheet of the multi-layer structure of atomically thin sheets is comprised of a transition metal dichaelcogenide and the transition metal dichalcogenide material has a larger concentration of electrons than holes and thus the step of doping occurs prior to the step of exfoliating. In other embodiments, the transition metal dichalcogenide material has a larger concentration of holes than electrons and thus the step of exfoliating occurs prior to the step of doping.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 5A is a diagram illustrating a two-dimensional model for Maxwell stress tensor calculation of surface charge-induced electrostatic attractive stress;

FIG. 5B is a graph plotting attractive stress as a function of position;

FIG. 5C is a graph plotting the attractive stress distribution for a single mesa;

FIGS. 12A-12E are diagrams depicting an example technique for fabricating a photovoltaic device;

Corresponding reference numerals indicate corresponding parts throughout the several views of the drawings.

DETAILED DESCRIPTION

Example embodiments will now be described more fully with reference to the accompanying drawings.

Figure 1A:
FIGS. 1A-1G are diagrams depicting an example technique for transfer-printing prepatterned $MoS_2$ flakes.

FIGS. 1A-1G schematically illustrates an example technique for fabricating a semiconductor device and in particular a technique for transfer-printing prepatterned $MoS_2$ flakes. In FIG. 1A, the process starts with a piece of pristine bulk transition metal dichalcogenide, such as $MoS_2$. A plate of bulk $MoS_2$ is mechanically exfoliated from a source sample and firmly attached onto a flexible copper trace. In the example embodiment, the plate has a surface with total area of ~1 cm².

Figure 1B:
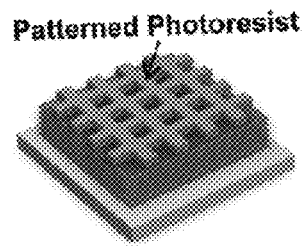
Figure 1C:
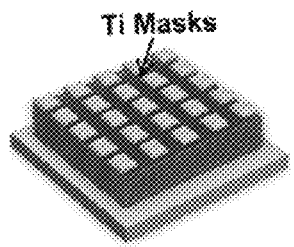

Photolithography is performed to pattern a photoresist layer spin-coated on top of the $MoS_2$ surface as seen in FIG. 1B. To pattern microscale relief features on the bulk $MoS_2$, a 1.4 μm thick photoresist layer is spun onto the $MoS_2$ surface and exposed to a Karl Suss MA6 photoaligner. The photomask used for this work bears periodic pillar patterns with pillar diameters ranging from 3 to 10 μm. Arrays of metal masks are then created by depositing 100 nm Ti using electron-beam evaporation followed with lift-off in acetone as shown in FIG. 1C.

Figure 1D:
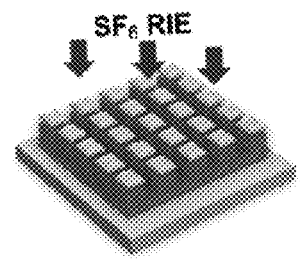
Figure 1E:
Figure 1F:
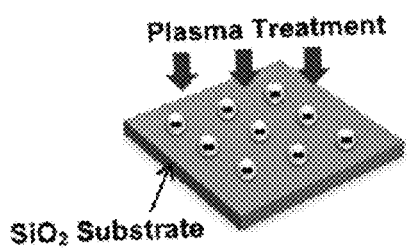
Figure 1G:
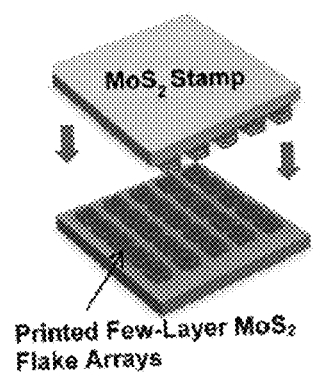

In FIG. 1D, $SF_6$-based reactive ion etching (RIE) is performed to transfer the Ti mask pattern onto underlying $MoS_2$. In this example, the Ti mask patterns are etched onto the underlying $MoS_2$ using a $SF_6$-based RIE recipe (i.e., $SF_6$ flow rate: 20 sccm, pressure: 20 mTorr, power: 200 W) with an etching rate of ~100 nm/min. In FIG. 1E, Ti masks are completely removed, for example in hydrofluoric (HF) acid, thereby creating a bulk $MoS_2$ stamp. In FIG. 1F, a $SiO_2$ substrate is treated by $O_2$ plasma to generate electric charges on the surface. Finally, the bulk $MoS_2$ stamp is used for printing out $MoS_2$ flake arrays onto the $SiO_2$ substrate as seen in FIG. 1G. To perform a transfer-printing process, a bulk $MoS_2$ stamp and a $SiO_2$/Si substrate are firmly pressed to each other by using a lab-made pressing system that can generate a gauge pressure up to 3 MPa for contact printing. To enhance the bonding strength between the $MoS_2$ flakes and the $SiO_2$ surface, an $O_2$-based plasma recipe (i.e., $O_2$ flow rate: 50 sccm, pressure: 25 mTorr, power: 100 W, time duration: 2 min) is used to treat the SiO$_2$ surface before the printing step. Variants of the plasma recipe are contemplated by this disclosure. For example, durations on the order of 10-20 seconds may also been found to be effective. Such a plasma treatment is expected to introduce uniformly distributed electric charges on the SiO$_2$ surface that can provide additional electrostatic attractive stress for exfoliating prepatterned few-layer MoS$_2$ flakes from the bulk stamp.

After the printing process, the printed MoS$_2$ patterns can be imaged by using a scanning electron microscope (SEM) in secondary-electron and back-scattered modes as well as an optical microscope. An atomic force microscope (AFM) is employed to measure the thickness of printed MoS$_2$ features in the tapping mode. In addition, an x-ray energy dispersive spectrometer (EDS) integrated with a SEM system is used to confirm the presence of MoS$_2$ features within the printed areas.

Figure 2:
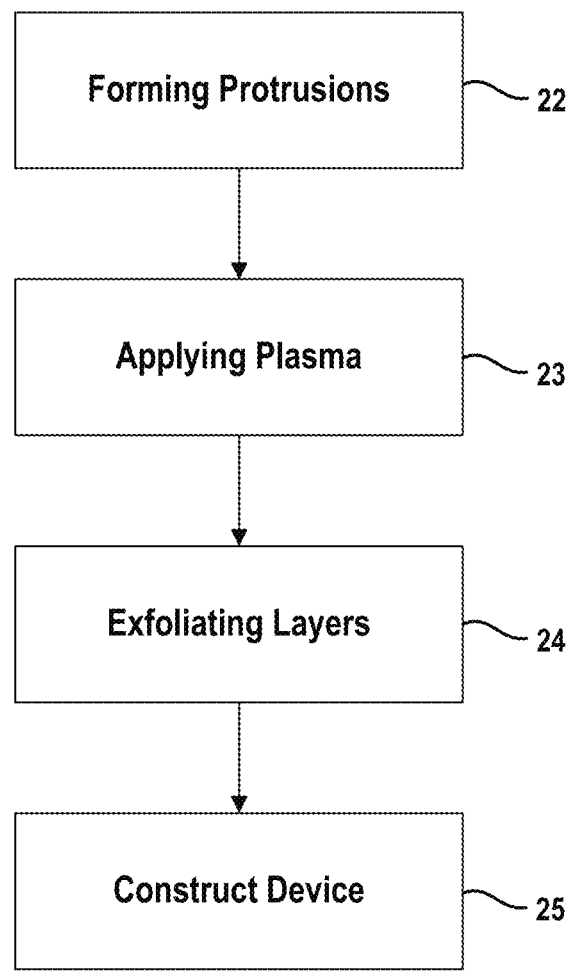
FIG. 2 is a flowchart is a generalized representation of an example technique for fabricating a semiconductor device.

This technique can be generalized as shown in FIG. 2. First, one or more protrusions are formed at 22 on a top surface of a plate using photolithographic techniques such as those described above. Other types of microfabrication techniques for forming the protrusions are also contemplated by this disclosure. The plate is a multi-layer structure of atomically thin two-dimensional sheets. Example materials for the sheets include molybdenum disulfide (MoS$_2$), graphene, boron nitride and other transition metal dichalcogenides.

A plasma is then applied at 23 to a planar surface of a substrate, for example by reactive ion etching. The plasma preferably contains oxygen or fluoride although other types of plasmas may be suitable. The material for the substrate are ones typically used in sold-state electronics, including but not limited to silicon, silicon dioxide, aluminum oxide, sapphire, germanium, gallium arsenide, etc.

Next, layers of the protrusions are exfoliated at 24 from the top surface of the plate onto the planar surface of the substrate. In one example, the layers are exfoliated by pressing the top surface of the plate against the planar surface of the substrate, for example using a pressing tool.

Lastly, a semiconductor device is constructed at 25 in part from the exfoliated layers residing on the substrate. For example, to fabricate back-gated MoS$_2$ FETs, the metallic drain/source contacts (5 nm Ti/55 nm Au) are fabricated by photolithography or electron-beam lithography (EBL) followed with metal deposition and lift-off. In particular, photolithography is used for fabricating FETs based on the inner flakes of MoS$_2$ pixels, and EBL is used for fabricating FETs based on the outer edge ribbons of MoS$_2$ pixels. Another metallic contact is made onto the p$^+$-Si substrate, which serves as a back gate contact. The device characteristic curves of these FETs can be measured using an Agilent-4145B semiconductor parameter analyzer.

This process can generate MoS$_2$ device patterns directly from pristine geographic MoS$_2$ materials that have the largest crystalline domains (typically, 1 to 100 s μm size) and the best electronic properties to date. Further, this approach can be generalized for manufacturing other emerging atomically layered nanomaterials, such as graphene, boron nitride (BN), and topological insulator thin films. It should be noted that such a plasma-assisted transfer-printing process is significantly advantageous over voltage-based electrostatic exfoliation methods for creating atomically layered materials, in terms of application scope and printing uniformity. In particular, plasma-assisted printing can be applied to any substrates with a dielectric layer, whereas voltage-based exfoliation processes can only be used for conductive substrates. Furthermore, plasma-induced surface charges are usually immobilized and uniformly distributed over dielectric substrates, and therefore result in uniform attractive stress for printing MoS$_2$ features over large areas. However, voltage-generated free charges are movable in the conductive substrate and they tend to accumulate at locations with the smallest stamp/substrate gap, resulting in nonuniform electrostatic printing stress and a high risk of electrical leakage.

Continuing with the example embodiment described in FIGS. 1A-1G, scanning electronic micrographs (SEMs) were obtained of an exemplary MoS2 stamp prepatterned with 5 μm size, 600 nm high pillars. A zoomed view shows that the SF$_6$ plasma-etched area exhibits a relatively high roughness that is attributed to plasma etching or ion bombardment. However, the raised pillar mesas protected by the Ti masks are still as smooth as a pristine MoS$_2$ surface. This should yield a conformal contact with the flat substrate during a mechanical printing process and therefore a high transfer-printing efficiency of MoS$_2$ flakes. The images, captured over a large printed area (~1 cm$^2$), show that the mechanical printing process can produce large-area, orderly paved arrays of MoS$_2$ pixel features. However, most of the printed pixels have relatively irregular edge profiles that are not faithfully correlated to the edge profiles of pillars pre-structured on the bulk stamp.

Figure 3:
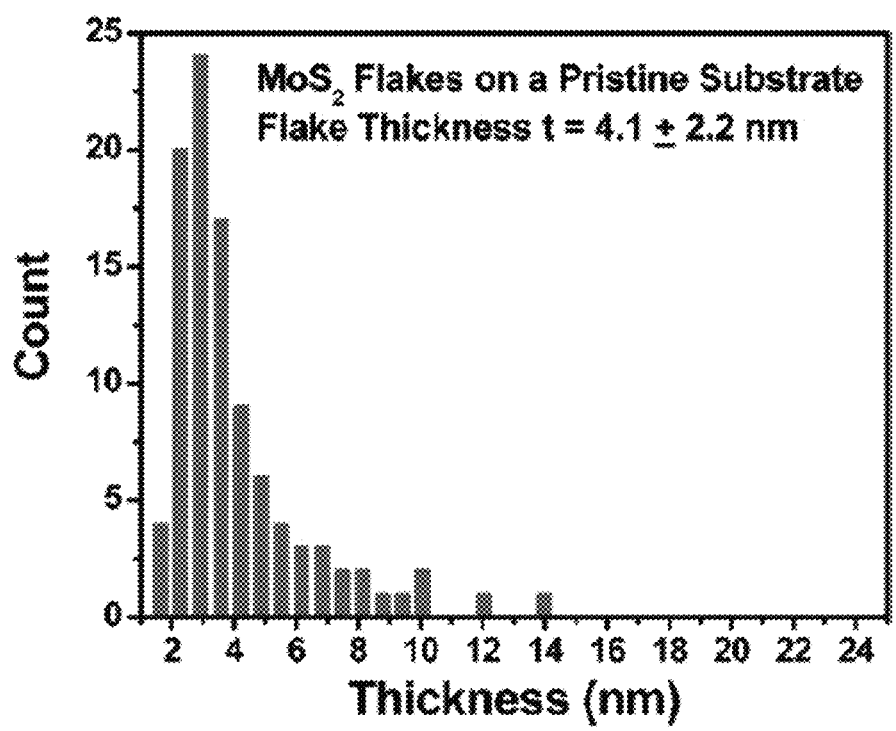
FIG. 3 is a graph plotting average thickness data collected from a hundred as-printed $MoS_2$ pixels.

The thickness data of MoS$_2$ pixels were obtained by using an atomic force microscope (AFM). For each of printed MoS$_2$ pixels, the average flake thickness was extracted from AFM topographic data. FIG. 3 plots the statistical distribution of the average thickness data of 100 MoS$_2$ flake pixels of 10 μm size produced in a single transfer-printing cycle. FIG. 3 shows that the overall average flake thickness is measured to be 4.1 nm (~6 monolayers), and the standard deviation is 2.2 nm (~3 monolayers) over ~1 cm$^2$ area. About 95% and 80% of printed MoS$_2$ flakes are thinner than 10 nm and 5 nm, respectively.

Multiple SEM images were taken of MoS$_2$ patterns printed onto an O$_2$ plasma-charged SiO$_2$ substrate. These images show that the printing process on plasma-charged substrates can produce large-area, orderly arranged arrays of MoS$_2$ flake pixels with a higher uniformity of pixel profiles in comparison with the printing result on a pristine substrate. In particular, MoS$_2$ pixel patterns feature clear, well-defined edge profiles that are faithfully correlated to the edge profiles of pillars pre-structured on the bulk stamp. Zoomed images reveal that the clear edge profile of a MoS$_2$ pixel is indeed made up of a ring-shaped MoS$_2$ ribbon. Such outer edge ribbons of MoS$_2$ pixels have widths ranging from 200 to 400 nm. Besides these edge ribbon features, there are indeed thinner MoS$_2$ films or flakes located in the inner regions of printed pixels enclosed by the edge ribbons. These inner MoS$_2$ flakes typically exhibit a poor feature contrast in secondary-electron images. To enhance the SEM contrast, printed MoS$_2$ pixels were also imaged by detecting back-scattered electrons (BSEs), which are often used to detect contrast between areas with different chemical compositions. The BSE image contrast suggests the presence of thin MoS$_2$ flakes within each of pixels. X-ray energy dispersive spectrometer (EDS) spectra were captured from the edge ribbons as well as the inner films of MoS$_2$ pixels. The EDS results confirm the presence of sulfur and molybdenum in both the edge and inner portions of printed pixels. The spatial variation of BSE image contrast and the EDS intensity of MoS$_2$-associated peaks suggest an inter-pixel variation of MoS$_2$ flake thickness over the printed substrate. To obtain the inner flake thickness data, MoS$_2$ pixels with partially broken inner films were imaged by using AFM, and the thickness of an inner MoS$_2$ flake was measured from its broken edges.

Figure 4A:
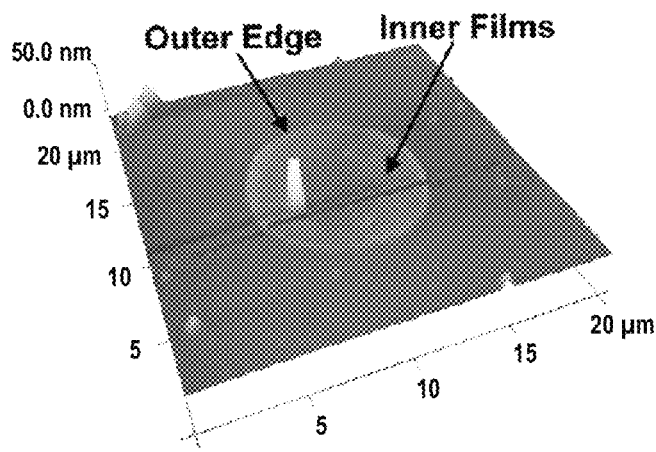
FIG. 4A is an AFM image of a $MoS_2$ pixel printed on a plasma-charged substrate.
Figure 4B:
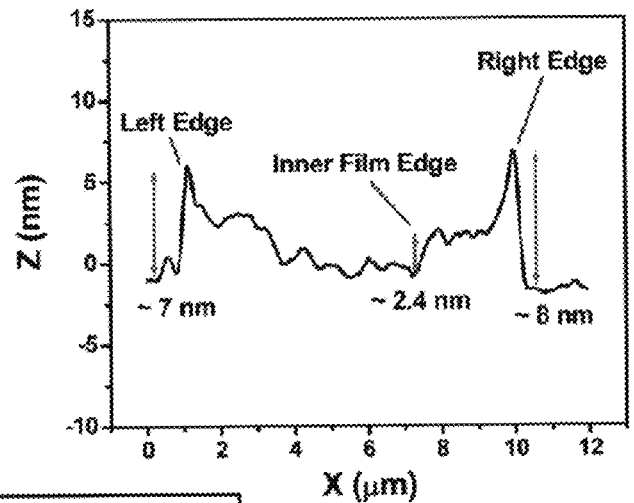
FIG. 4B is a graph of a scanning trace across the pixel in FIG. 4A.
Figure 4C:
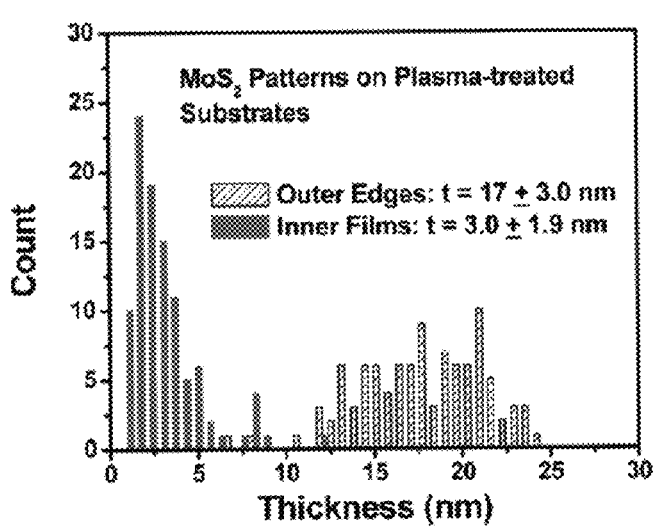
FIG. 4C is a stacked column chart plotting the average thickness data collected from a hundred as-printed $MoS_2$ pixels.

FIG. 4A displays an AFM image of an exemplary MoS$_2$ pixel consisting of a relatively thick edge ribbon and broken inner flakes. The scan line denoted by the solid line and accordingly plotted in FIG. 4B explicitly displays that the thickness values measured at the left and the right sides of this outer edge ribbon are 7 nm (~11 monolayers) and 8 nm (~12 monolayers), respectively; the thickness of the broken inner flakes is measured to be 2.4 nm (~4 monolayers). The thickness data acquired from 10 scan lines are used to calculate the average thickness of the inner film and the outer edge ribbon of an individual $MoS_2$ pixel. FIG. 4C plots the statistical distribution of the average thickness data of 100 $MoS_2$ pixels printed on a plasma-charged substrate. Here, the thickness data of inner films (solid columns) and outer edge ribbons (blue hatched columns) of $MoS_2$ pixels are separately plotted. FIG. 4C shows that the overall average thickness of outer edge ribbons is 17 nm (~26 monolayers) with a standard deviation of 3 nm (~5 monolayers); whereas the overall average thickness of inner films is 3.0 nm (~5 monolayers) with a standard deviation of 1.9 nm (~3 monolayers). About 90% of inner flakes of $MoS_2$ pixels printed on a plasma-charged $SiO_2$ substrate are thinner than 5 nm (~8 monolayers). Based on such SEM, AFM, EDS, and optical micrograph characterizations, it is concluded that microscale $MoS_2$ pixels printed on plasma-charged $SiO_2$ surface feature relatively thinner inner films or flakes enclosed by relatively thicker ring-shaped edge ribbons and a higher percentage yield of few-layer-$MoS_2$ flakes thinner than 5 nm in comparison with pixels printed on a pristine $SiO_2$ substrate.

To obtain a preliminary understanding of plasma-assisted printing mechanisms responsible for the resultant morphology of $MoS_2$ pixels, Maxwell stress tensor calculation was performed and used for evaluating the distribution of surface charge-induced electrostatic attractive stress between the bulk MoS2 stamp and the dielectric substrate. FIG. 5A illustrates the 2-D model for the calculation, in which a plasma-charged SiO2 substrate is in contact with a bulk MoS2 stamp and the surface charge density is arbitrarily set to 0.05 $C/m^2$. FIG. 5B plots the calculated attractive stress exerted by the plasma-charged SiO2 substrate on the bulk MoS2 stamp as a function of positions. FIG. 5C shows the zoomed view of attractive stress distribution within a single MoS2 mesa in contact with SiO2 surface. It is found that the attractive stress acting on a microscale MoS2 mesa is uniform in the central region of the mesa but is significantly increased along the mesa edges due to the fringe effect. During a transfer-printing process, such high attractive stress at the mesa edges is expected to result in the exfoliation of MoS2 flake pixels with well-defined edges, as experimentally demonstrated. In addition, the strong electric field at the MoS2/SiO2 interface is expected to influence dispersion and dipole interactions of atoms there and therefore change the cohesive energy of MoS2 layers close to the SiO2 surface. This could lead to a dependence of the number of printed MoS2 monolayers on the field magnitude, which could qualitatively explain the experimental result that for MoS2 pixels printed on plasma-charged substrates, the edge portions are statistically thicker than the inner flakes, as shown in FIG. 4C.

Figure 6A:
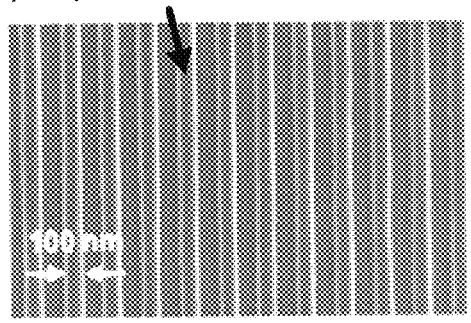
FIG. 6A is an SEM image of a HOPG stamp prepatterned with 100 nm half-pitch relief gratings.
Figure 6B:
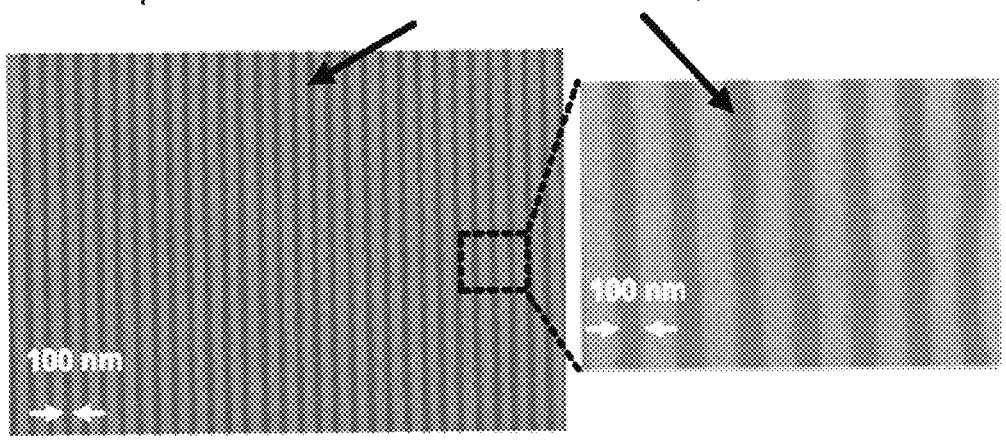
FIG. 6B is an SEM image of graphene nanoribbons printed onto a plasma-charged substrate.

Although plasma-assisted printing can produce large-area arrays of microscale MoS2 pixels with regular edge profiles, many pixels have broken areas in their central regions. This can be attributed to several possible reasons, including the limited size of crystalline domains in bulk $MoS_2$, nonuniformity of attractive stress within a microscale $MoS_2$ pixel mesa, as discussed in the simulation analysis, and the paradigm rule that the direct exfoliation of a large-area atomic layer (e.g., a complete microscale $MoS_2$ pixel film free of defects) is thermodynamically unfavorable. Such an analysis suggests that it is indeed desirable to prepattern bulk $MoS_2$ stamps with densely arranged nanostructures that can improve the printing fidelity and eliminate the defects in the middle of printed patterns. In addition, such relief nanostructures are expected to generate the higher fringe field during printing processes because of the higher density of sharp feature edges and result in the higher transfer-printing efficiency of $MoS_2$ features. A scalable process for patterning nanostructures on bulk MoS2 is envisioned. Nanopatterning of highly oriented pyrolytic graphite (HOPG) stamps with 100 nm half-pitch gratings has been realized using nanoimprint lithography, as shown in FIG. 6A. FIG. 6B shows SEM images of 100 nm half-pitch graphene nanoribbons (GNRs) produced by using plasma-assisted transfer-printing. The printed GNRs exhibit a high degree of uniformity in ribbon widths over large areas and do not exhibit any visible defects in the middle of individual ribbons. The thickness of GNRs was measured to be 2.0±1.0 nm by using an AFM. This work demonstrates that (1) nanoscale defect-free atomic layer patterns can be more easily produced by using plasma-assisted printing in comparison with microscale ones; (2) plasma-assisted printing can be generalized for producing high-quality nanostructures of other atomically layered materials.

Figure 7A:
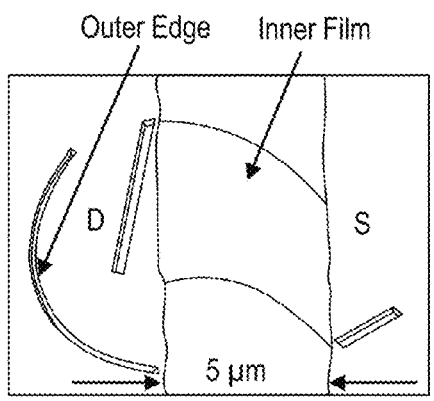
FIG. 7A is a BSE image of an inner flake of a printed MoS2 pixel that was used to fabricate an exemplary back-gated FET.
Figure 7B:
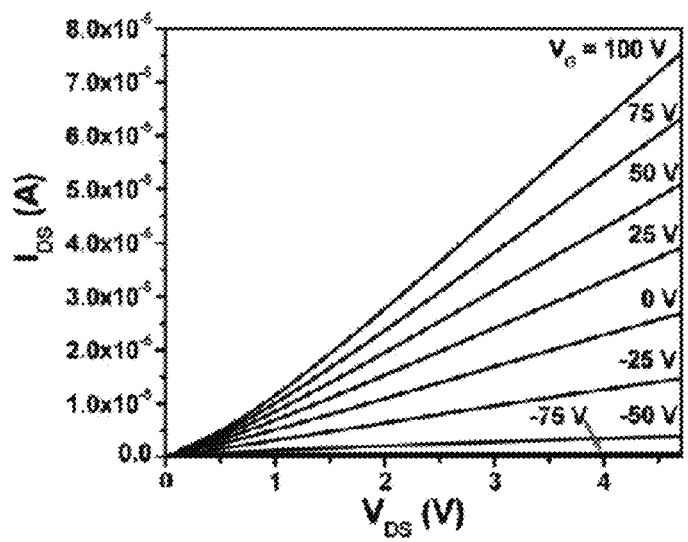
FIG. 7B is a graph plotting drain-source current versus drain-source voltage characteristics of the example FET under different gate voltages.
Figure 7C:
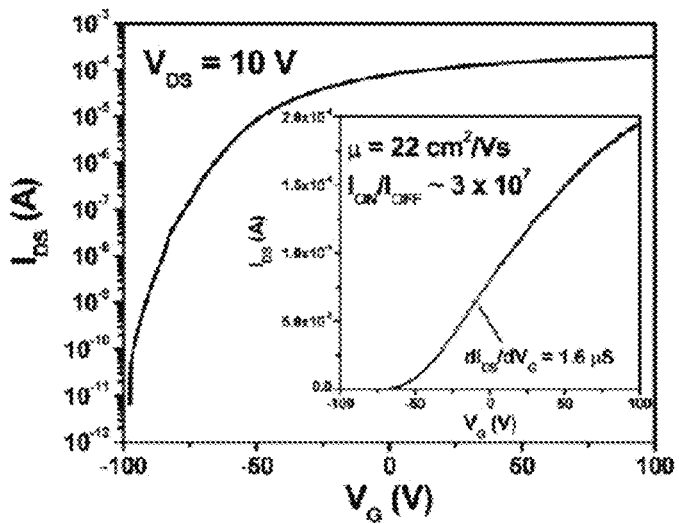
FIG. 7C is a graph plotting drain-source current versus drain-source voltage characteristics of the example FET under fixed drain-source voltage.

To evaluate the electronic properties of printed $MoS_2$ flakes, field-effect transistors (FETs) were fabricated using $MoS_2$ pixels printed on plasma-charged $SiO_2$/p+Si substrates. FIG. 7A shows a BSE image of an inner flake of a MoS2 pixel that was used to fabricate a back-gated FET with flake thickness of ~5 nm, channel length of L=5.4 μm, average channel width of W~3.7 μm, and gate dielectric thickness of d=330 nm. FIG. 7B plots drain-source current (IDS)–drain-source voltage (VDS) characteristics of this exemplary FET under different gate voltages (VG) ranging from −75 to 100 V. FIG. 7C plots the $I_{DS}$–$V_G$ characteristics under a fixed drain-source voltage ($V_{DS}$=10 V). As shown in FIGS. 7B and 7C, this FET exhibits n-type conduction with an ON/OFF current ratio ($I_{ON}/I_{OFF}$) of ~$10^7$. The transconductance at the linear region of the $I_{DS}$–$V_G$ characteristic curve was obtained to be $dI_{DS}/dV_G$=1.60 μS by the linear fitting (denoted with the solid line in the inset of FIG. 7C). The field-effect mobility was estimated to be μ=22 $cm^2$/Vs by using equation 1 (valid for the linear region of $MoS_2$-based FETs with microscale channel widths), where $\epsilon_0$ is the vacuum permittivity; $\epsilon_r$~d 3.9 is the dielectric constant of $SiO_2$; $C_{ox}$ is the gate capacitance; W/L is the width/length ratio of the MoS2 flake channel. The field-effect mobility values obtained from other FETs made from the inner flakes of printed MoS2 pixels range from 6-44 $cm^2$/(V s), which are comparable to the highest mobility values previously reported for $MoS_2$ FETs using $SiO_2$ as the gate dielectric. This indicates that this transfer-printing approach can produce high-quality MoS2 features and are suitable for practical nanoelectronic applications.

$$\mu = \frac{1}{C_{ox}\frac{W}{L}V_{DS}}\left(\frac{dI_{DS}}{dV_G}\right) \quad C_{ox} = \frac{\varepsilon_0 \varepsilon_r}{d} \quad (1)$$

Figure 8A:
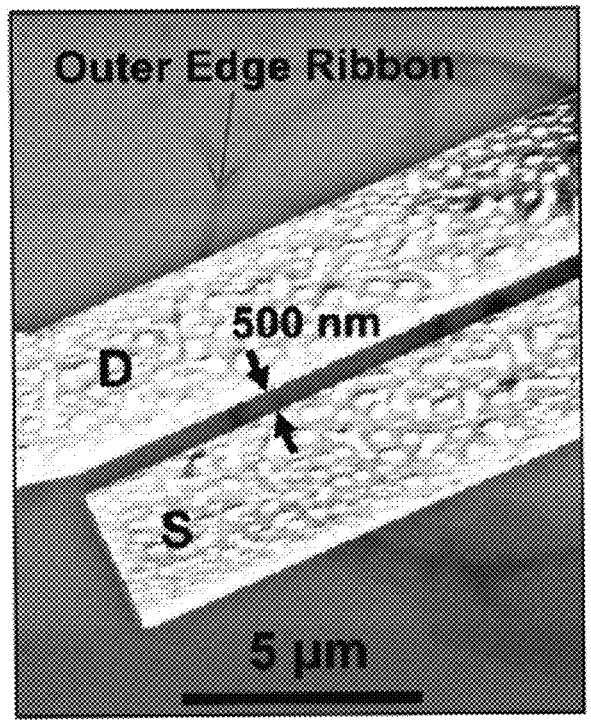
FIG. 8A is an SEM image of an exemplary back-gated FET made from the outer edge ribbon of a printed MoS2 pixel.
Figure 8B:
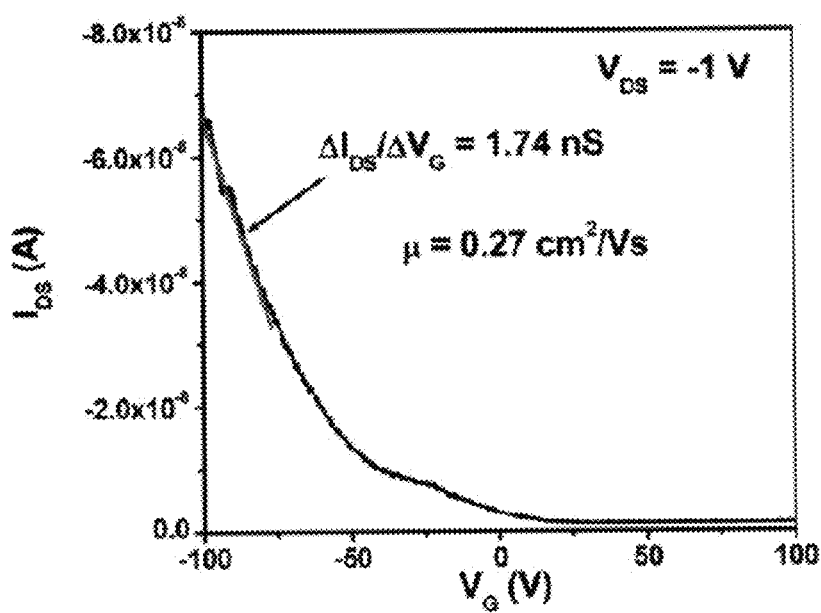
FIG. 8B is a graph plotting drain-source current versus drain-source voltage characteristics of the example FET.
Figure 8C:
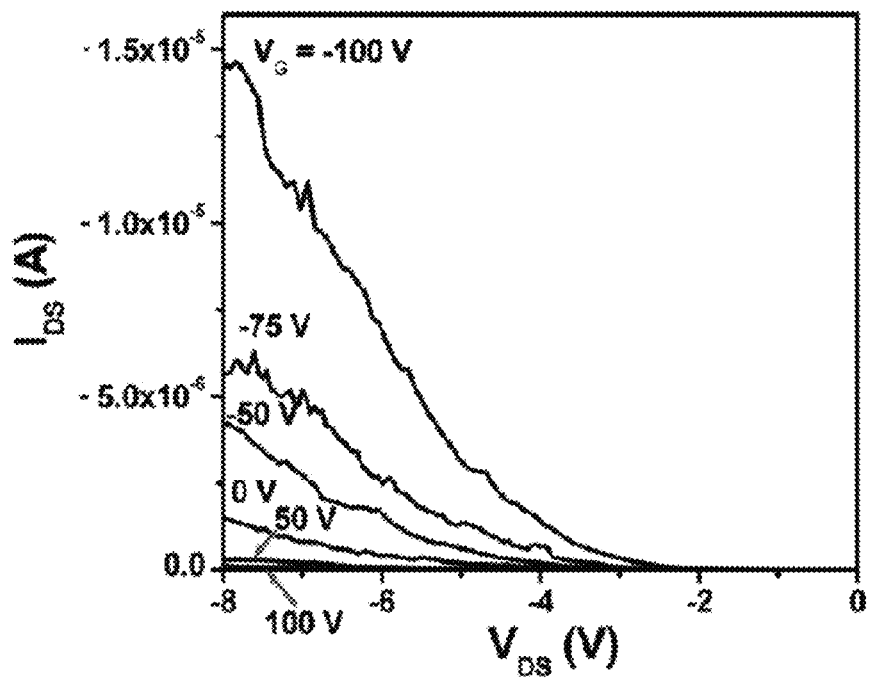
FIG. 8C is a graph plotting drain-source current versus gate voltage for the example FET.

FETs were also fabricated using the ring-shaped edge ribbons of $MoS_2$ pixels as the semiconducting channels. To make an edge ribbon-based FET, electron-beam lithography (EBL) followed with metal evaporation and lift-off was performed to fabricate drain and source electrodes precisely aligned to the specific segment of the edge ribbon of a $MoS_2$ pixel. In EBL, the overlay alignment was carefully performed to avoid incorporating any inner pixel flakes into the FET channel. FIG. 8A shows a SEM image of an exemplary edge ribbon-based FET with channel width of W≈300 nm, channel length of L≈500 nm, and average $MoS_2$ thickness of ~10 nm. FIGS. 8B and 8C display $I_{DS}$-$V_{Ds}$ and $I_{Ds}$-$V_G$ characteristics, respectively, which show that this edge ribbon-based FET exhibits p-type conduction for VG=−100 to 100 V. The transconductance at the linear region of the IDS− VG characteristic curve was obtained to be $dI_{DS}/d_{VG}$=− 1.74 nS by the linear fitting (denoted with the red solid line in the inset of FIG. 8C). The field-effect mobility was estimated to be $\mu$=0.27 cm²/(V s) by using equation 2, where $C_g$ is the average gate capacitance associated with a single $MoS_2$ edge ribbon per unit channel length [unit: F/m]. Here, $C_g$ is calculated by using a simulation model based on finite element analysis (FEA) that takes into account the fringe effect at the $MoS_2$ nanoribbon edges. Such a fringe effect can significantly affect the values of $C_g$ for $MoS_2$ FETs with nanoscale channel widths. The field-effect mobility values measured from other edge ribbon-based FETs range from 0.1 to 1.0 cm²/Vs.

Figure 8D:
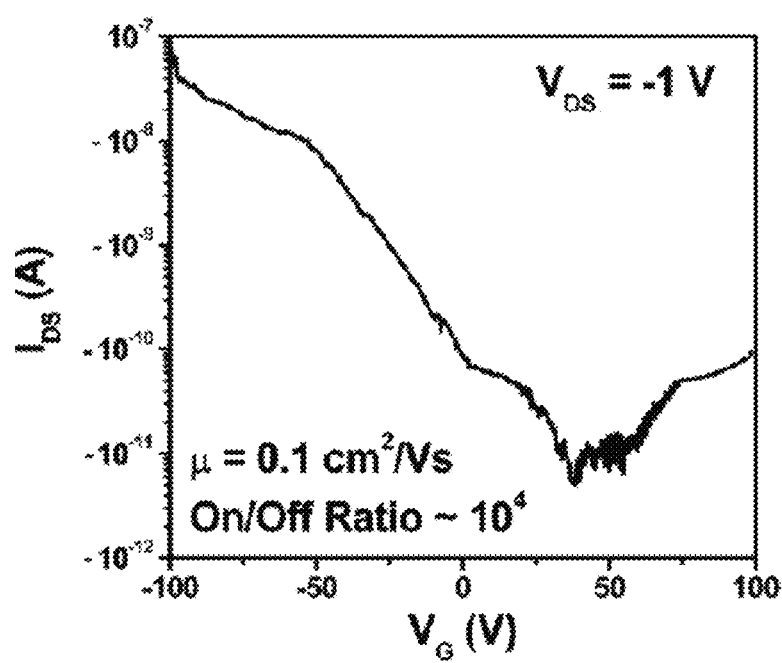
FIG. 8D is a graph plotting drain-source current versus gate voltage for a p-type FET made from a MoS2 flake blank-treated by plasma.
Figure 9A:
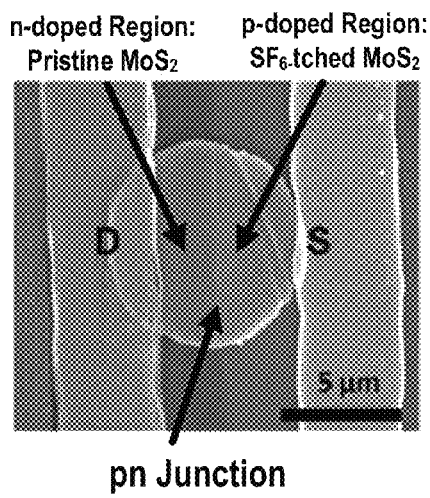
FIG. 9A is a SEM image of a p-n junction formed by partial etching of a MoS2 pixel.
Figure 9B:
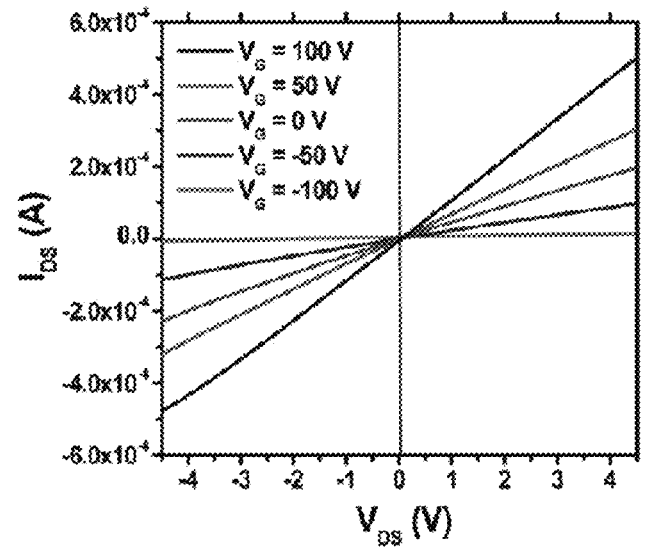
FIG. 9B is a graph plotting drain-source current versus drain-source voltage characteristics of the MoS2 pixel FET under various gate voltages measured before plasma etching.
Figure 9C:
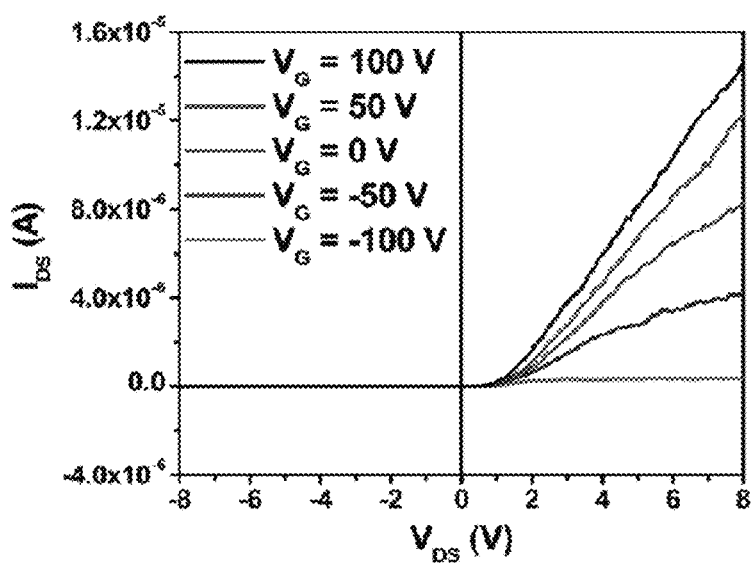
FIG. 9C is a graph plotting drain-source current versus drain-source voltage characteristics of the MoS2 pixel FET under various gate voltages measured after plasma etching.

The p-type conduction is generally observed in other edge ribbon-based FETs and it is attributed to the chemical doping to the edge portions of MoS2 pixels, which might be induced during the $SF_6$ RIE process for patterning pillars in bulk MoS2 stamps. To further identify such a plasma-induced doping mechanism, a pristine 10 μm size MoS2 flake with initial thickness of ~20 nm was blank-etched by SF6 plasma. After etching, the flake thickness was reduced to ~10 nm. The FET made from this flake also exhibits p-type conduction, as shown in FIG. 8D. The field-effect mobility is extracted to be ~0.1 cm²/(V s), which is consistent with the mobility values measured from edge ribbon-based FETs. This test verifies that the p-type conduction is indeed caused by the plasma-induced doping. This also provides a simple method for making p-type MoS2 FETs and rectifying diodes. For example, a n-type FET made from a 40 nm thick MoS2 pixel was partially etched with SF6 plasma in selected areas to form a p-doped region (i.e., the etched region with the final MoS2 thickness of ~20 nm) adjacent to the n-doped region (i.e., the pristine region protected by a patterned photoresist layer), as shown in FIG. 9A. FIGS. 9B and 9C show the IDS-VDS characteristics of this FET measured before and after the plasma etching, respectively. Before etching, the FET exhibits linear and symmetric IDS-VDS characteristics independent of the polarity of VDS, whereas after etching, it exhibits a strong rectification of the drain-source current. This indicates the formation of a pn junction in the $MoS_2$ pixel.

$$\mu = \frac{1}{C_g V_{DS}} \left( \frac{dI_{DS}}{dV_G} \right) \quad (2)$$

The proposed printing approaches can generate few-layer-$MoS_2$ flakes with the change of thickness mainly in the range of 0.7-10 nm on a pristine $SiO_2$ substrate or 0.7-5 nm on a plasma-charged substrate. As-printed MoS2 pixels with such flake thickness distributions over large areas are still suitable for scale-up transistor-based electronic applications (if not for all applications), because previous works have demonstrated that FETs made from multilayer $MoS_2$ flakes with thicknesses ranging from 2-50 nm exhibit excellent and stable transport properties (i.e., high ON/OFF ratios ranging from 104-107, high field-effect mobility values on the order of 10 s cm2/Vs on SiO2-based dielectrics and 100 s cm2/Vs on high-k dielectrics, as well as subthreshold slopes of 60-70 mV/decade for top-gated FETs).

Figure 10A:
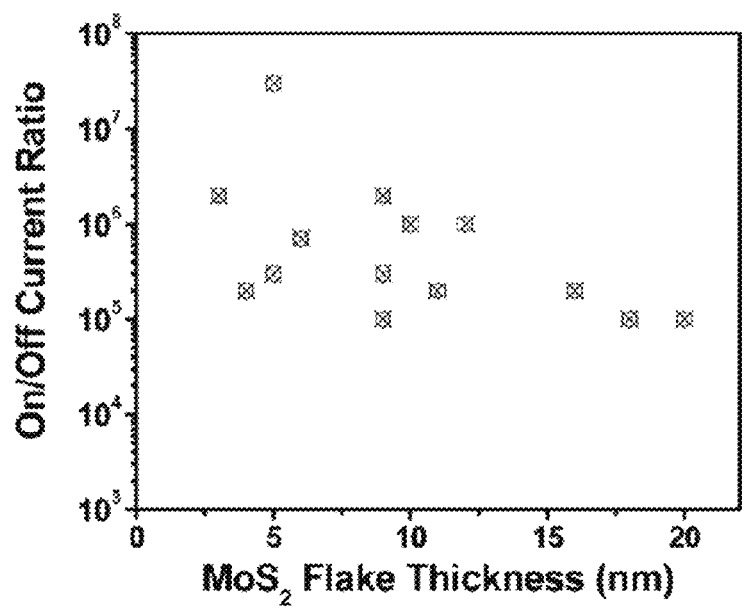
FIGS. 10A and 10B are graphs depicting On/Off current ratio and field-effect mobility data, respectively.
Figure 10B:
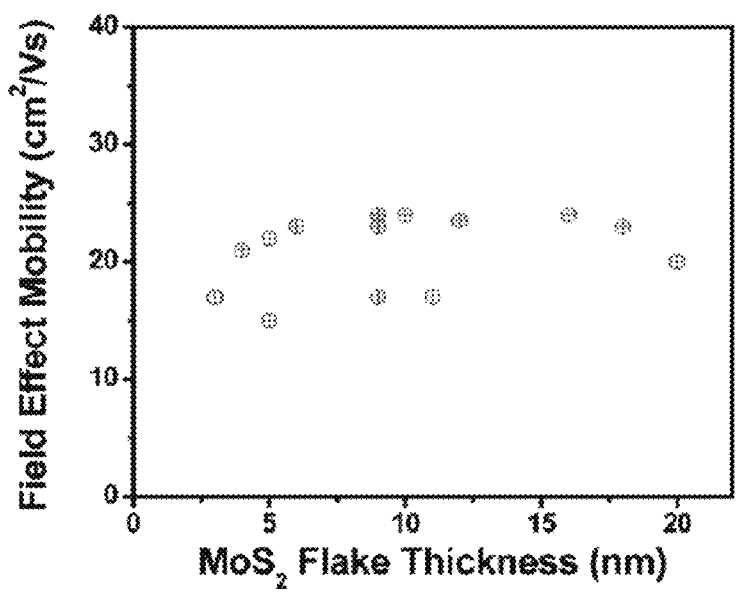

To evaluate the potential scalability of the proposed printing approaches especially for future scale-up transistor-based applications, the uniformity of the transport characteristics of $MoS_2$ FETs produced by plasma-assisted printing is investigated as well as the dependence of FET characteristics on the change of the $MoS_2$ thickness. FIG. 10 displays (a) ON/OFF current ratio and (b) field-effect mobility data measured from these FETs, which are plotted as a function of the $MoS_2$ thickness. These FETs have different flake thicknesses ranging from 3 to 20 nm. It should be noted that although the thickness values of most as-printed $MoS_2$ flakes can be controlled to be less than 10 nm, relatively thicker flakes (i.e., thickness ~10-20 nm) were intentionally chosen for making FETs in order to extend the investigation range of the flake thickness values and analyze the degree of redundancy in the control of the $MoS_2$ thickness. FIG. 10 shows that in spite of the variation of the $MoS_2$ flake thickness in the range of 3-20 nm, all the FETs exhibit high ON/OFF ratios in the range of $10^5$-$10^7$, reasonably high field-effect mobility values on $SiO_2$ gate dielectrics ranging from 15 to 24 cm²/Vs, and uniform threshold gate voltages around $V_{th}$~−50 V. Such results preliminarily demonstrate that the $MoS_2$ FETs produced by plasma-assisted printing do not exhibit a sensitive dependence of FET characteristics on the change of the $MoS_2$ thickness in the range of 3-20 nm. This also suggests that the proposed printing approaches can generate a high yield of electronic-grade $MoS_2$ flakes with an acceptable degree of uniformity in FET characteristics and hold significant potential to be further developed into a manufacturing process for making arrays of working FETs. In addition, using $HfO_2$-based high-k gate dielectrics, the mobility values of the FETs are expected to be further improved by at least one order of magnitude, which is attributed to the dielectric screening effect. The large-arrays of such high-performance FETs produced by printing processes are expected to significantly facilitate the future scale-up electronic applications of few-layer-$MoS_2$.

There are device applications requiring a more demanding control of the MoS2 thickness. For example, optoelectronic applications usually need MoS2 monolayers to obtain a large direct bandgap. For such applications, the proposed printing approaches can potentially serve as a useful technique for paving initial raw materials of few-layer-$MoS_2$ into arrays of active device sites. These orderly paved $MoS_2$ flakes can be subsequently tailored through a series of post-printing processes to achieve a higher degree of uniformity in thickness and feature profile. For example, the laser-thinning technology with a self-termination mechanism could be used as a post-printing process for thinning as-printed $MoS_2$ flakes to increase the percentage yield of $MoS_2$ monolayers. Furthermore, a post-printing lithography step (e.g., photolithography and nanoimprint) followed with plasma etching can be easily implemented to trim as-printed $MoS_2$ flakes into functional nanopatterns with specific shapes.

In another aspect of this disclosure, two-dimensional (2D) layered transition metal dichalcogenides (LTMDs) exhibit attractive optoelectronic properties, e.g., the unique valley-polarized optical response observed in $MoS_2$, fast photoresponse speed, and very high light absorption over a broad range of wavelengths. In particular, a single semiconducting LTMD layer (~0.5 nm thick) can absorb as much sunlight as 50 nm of Si (or 12 nm of GaAs) and generate photocurrents as high as 4.5 mA/cm². This high light absorption is attributed to the rich of van Hove singularity peaks in the electronic density of states (DOS) of these semiconducting LTMDs (including monolayer, few-layer, and multilayer LTMDs), which results in a sharp rise of joint density of states (JDOS) in the visible light range and ensures relatively strong light-matter interactions. Therefore, semiconducting LTMDs can potentially be used for making flexible ultrathin PV cells with 1-3 orders of magnitude higher power densities (i.e., solar power converted per unit volume of photoactive materials) than the best existing thin-film PV cells. It should be noted that although power density is not a standard figure of merit for PV performance, the higher power density could decrease the needed photoactive layer thickness for achieving a given amount of light absorption, and therefore enable highly flexible PV cells with substantial power-conversion efficiency (PCE) and external quantum efficiency (EQE) as well as thin-film photodetectors with sizable responsivity.

Semiconducting LTMDs are anticipated to offer additional advantages in serving as PV active materials, including (i) excellent chemical stability (i.e., LTMDs are chemically stable 2D crystals); (ii) good mechanical flexibility and durability comparable to graphene; (iii) superior electronic and electrical properties for fabricating functional interfaces with other 2D materials (e.g., graphene-based conductors and boron nitride (BN)-based dielectrics), because they can form high-quality heterojunction and interfaces with an extremely low areal density of dangling bonds and charge traps. Such heterojunctions could address the challenges associated with interfacial recombination centers that impact the photovoltaic efficiencies. It should be noted that such stacked 2D heterostructures are distinct from the stacked thin films of 3D materials that usually have a high density of interfacial traps. Lastly (iv) low production cost, i.e., LTMD-based ultrathin PV cells, similar to graphene-based devices, could potentially be manufactured on low-cost flexible substrates by using roll-to-roll deposition and printing processes.

Although semiconducting LTMDs exhibit very strong light-matter interactions and very high light absorption coefficients, LTMD-based PV cells with superior PV performance have not been demonstrated. In particular, the current single and few-layer LTMD PV and photodetector devices only showed a high photocurrent density per unit photoactive layer thickness (e.g., 4.5 mA/cm$^2$ per LTMD monolayer). To obtain sizable photocurrents and photovoltage outputs for practical PV applications, multilayer LTMD PV devices are needed. However, the current multilayer LTMD PVs exhibit relatively poor values of critical figures of merit, including low short-circuit photocurrent density ($J_{sc}$<6 mA/cm$^2$), external quantum efficiency (EQE <40% over the visible light range), open-circuit voltage ($V_{oc}$<0.6 V), fill factor (FF<0.55), and photo-conversion efficiency (PCE<2%). To improve these performance parameters, for tailoring the band structures of LTMD PV devices. Especially, new approaches are needed for creating built-in potentials (or electric fields) inside LTMD photoactive layers that can facilitate the collection of photo-generated carriers, enhance the output photovoltages, and effectively suppress the reverse dark saturation currents.

Figure 11:
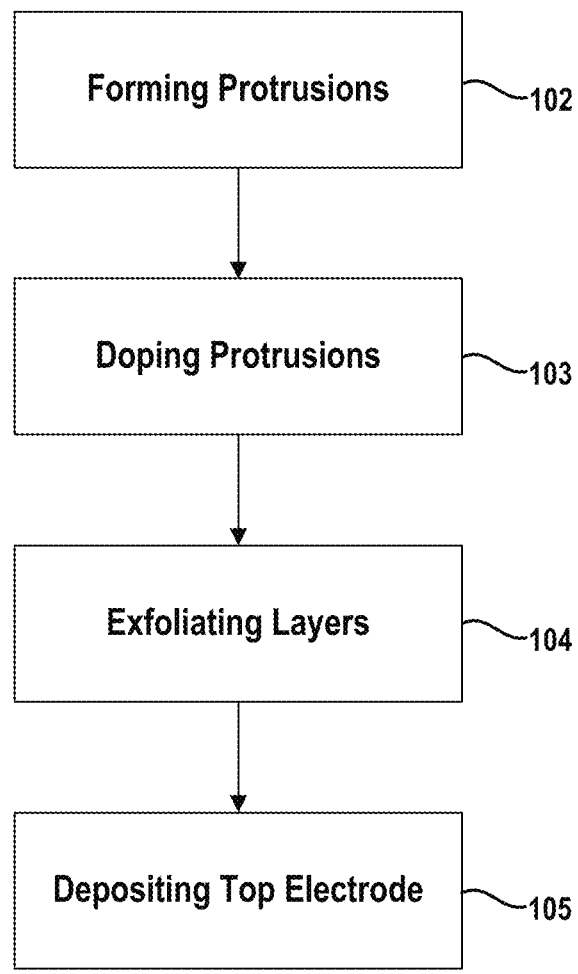
FIG. 11 is a flowchart depicting another plasma-assisted technique for fabricating a semiconductor device.

Plasma-assisted doping can serve as a new and very effective method to fabricate a photovoltaic device as described in relation to FIG. 11. One or more protrusion are again formed at 102 on a top surface of an ingot using photolithographic techniques such as those described above in relation to FIGS. 1A-1G. The ingot may be in the form of a plate having a multi-layer structure of atomically thin two-dimensional sheets. Material for the sheets may be, for example a transition metal dichalcogenides. Example materials may include but are not limited to molybdenum disulfide, tungsten diselenide, and other similar two-dimensional layered materials. Other types of microfabrication techniques for forming the protrusions are also contemplated by this disclosure.

The protrusions are doped at 103 by applying a plasma to the protrusions, for example using reactive ion etching. Plasmas may include dioxygen, sulfur hexafluoride, carbon tetrafluoride and fluoroform. The plasma preferably contains oxygen or fluorode although other types of plasmas may be suitable.

In one example, the two-dimensional layered material has a larger concentration of electrons than holes (i.e., n-type), such as molybdenum disulfide. Doping the MoS$_2$ forms top layers of a p-type material and thus a p-n junction. Layers of the protrusions are then exfoliated at 104 from the ingot onto a bottom electrode. The layers may be exfoliated, for example by pressing the top surface of the ingot against a planar surface of the bottom electrode using a pressing tool. It is understood that the bottom electrode may be gold or other suitable metals.

In an alternative example, the two-dimensional layered material has a larger concentration of holes than electrons (i.e., p-type), such as tungsten diselenide. In this example, layers of the protrusions are first exfoliated from the ingot onto the bottom electrode. The exfoliated layers of the protrusions are then doped by applying a plasma, thereby forming top layers of a n-type material and a p-n junction.

In either example, a top electrode is deposited at 105 onto the exfoliated layers to form a photovoltaic device. The top electrode may be deposited using photolithographic techniques and comprised of a transparent material, such as indium tin oxide. While reference has been made to a photovoltaic device, it is understood that this technique for forming a p-n junction may be used to fabricate other types of semiconductor devices as well.

FIGS. 12A-12E further depict an example technique for fabricating a photovoltaic device with MoS$_2$ photoactive layers. First, a pristine MoS$_2$ ingot stamp bearing protrusive mesa features is fabricated by using a photolithography method as shown in FIG. 12A. Such mesa features define the patterns of to-be-exfoliated multilayer MoS$_2$ flakes that will serve as PV photoactive layers. For this example, the bulk MoS$_2$ ingot samples were obtained from SPI with sample size ~1 cm$^2$.

Before the exfoliation, the top surface of the stamp is treated with a plasma species (e.g., O$_2$, SF$_6$, or CHF$_3$) using a standard reactive ion etching to induce doping in the top MoS$_2$ layers as seen in FIG. 12B. In this example, the RF power was fixed to 100 W; the pressure was 10 mTorr; the precursor gas flow rate was 10 sccm; and the treatment time was about 1 min. Treatment times on the order of 10 seconds were also found to be effective.

Following this treatment, the protrusive mesa features are mechanically exfoliated onto 50 nm thick Au electrodes as seen in FIG. 12C. To exfoliate the plasma-treated MoS$_2$ flake pixels onto the device substrates, the MoS$_2$ ingot stamps were pressed onto the pre-patterned Au cathodes on substrates and subsequently released by using a custom-made pressing tool. The Au cathodes (5 nm of Ti/70 nm of Au) were fabricated by photolithography followed by metal deposition and lift-off. The resulting multilayer MoS$_2$ flakes range in thickness from 10-140 nm. The surface analysis of plasma-doped MoS$_2$ flakes was performed by using an X-ray photoelectron spectroscope To form a top electrode, 50 nm ITO films were deposited on top of the exfoliated multilayer MoS$_2$ flakes by using an ion-beam sputter in FIG. 12D. The as-deposited ITO films were thermally annealed in a vacuum chamber at 300° C. for 40 min to enhance their conductivity and transparency. Finally, a standard AM1.5G solar simulator can be used for the PV characterization as shown in FIG. 12E.

Figure 13A:
FIGS. 13A and 13B are optical micrographs of an exemplary MoS2 ingot stamp and MoS2 flakes mechanically exfoliated onto a substrate, respectively.
Figure 13B:
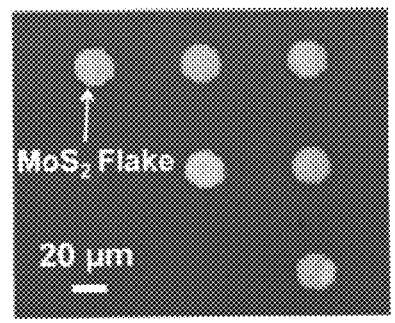
Figure 13C:
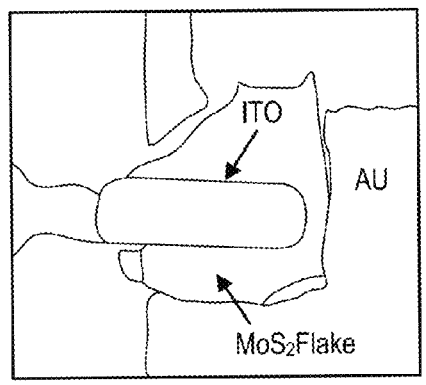
FIG. 13C is a top view of a vertically stacked plasma-treated structure.
Figure 13D:
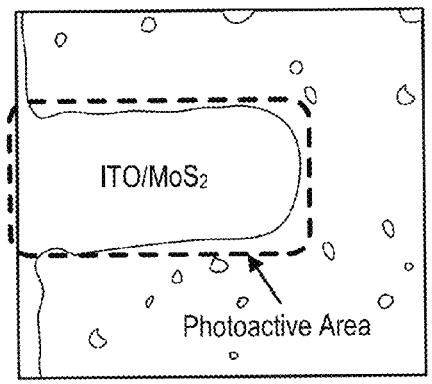
FIG. 13D is a diagram of the structure in FIG. 13C after plasma etching.

FIG. 13A displays an optical micrograph (OM) of an exemplary MoS$_2$ ingot stamp bearing 20 μm size mesa structures that was treated with CHF$_3$ plasma. FIG. 13B shows an image of MoS$_2$ flakes mechanically exfoliated onto a SiO$_2$/Si substrate (oxide thickness, 300 nm) with different thicknesses that are corresponding to different flake colors. Most exfoliated flakes are 20 to 150 nm thick, as measured by using an atomic force microscope (AFM). Though not suitable for immediate scale-up PV applications, this exfoliation printing method provides useful MoS$_2$ sample arrays for systematically studying the effect of MoS$_2$ photoactive layer thicknesses on PV performance parameters. FIG. 13C displays the top-view image of a vertically stacked Au/plasma-treated MoS$_2$/untreated MoS$_2$/ITO structure. It should be noted that there is a marginal MoS$_2$ area that is not fully sandwiched by ITO and Au electrodes. To study the PV effect associated with carriers moving along the vertical direction, this marginal MoS$_2$ area is etched away by using a SF$_6$ plasma recipe. FIG. 13D shows the image of the device structure after the SF$_6$ plasma etching. The final area of the MoS$_2$ flake is defined as the photoactive area for evaluating J$_{sc}$ and EQE values, as indicated by the dashed box in FIG. 13D. Here, it is noted that the MoS$_2$ photoactive area sandwiched by Au and ITO electrodes appears to be very dark under the OM illumination. This implies a high light absorption in MoS$_2$ layers, which is an important basis for achieving high J$_{sc}$ and EQE values in MoS$_2$ PV devices.

For a systematic study, several MoS$_2$ PV devices were first fabricated and treated with different plasma species (i.e., O$_2$, SF$_6$, CF$_4$, and CHF$_3$) and performed a brief I-V characterization under illumination of 532 nm laser light (power density, P$_{laser}$=283 mW/cm$^2$). For all devices, the MoS$_2$ photoactive layer thickness is ~100 nm. This brief characterization shows that the CHF$_3$ plasma-treated PV devices exhibit the highest PV performance in terms of the highest values of J$_{sc}$, V$_{oc}$, FF, and PCE parameters. Here, PCE=J$_{sc}$V$_{oc}$FF/P$_{laser}$. Therefore, the following analysis and discussion focus on CHF$_3$ plasma-treated MoS$_2$ PV devices.

Figure 14A:
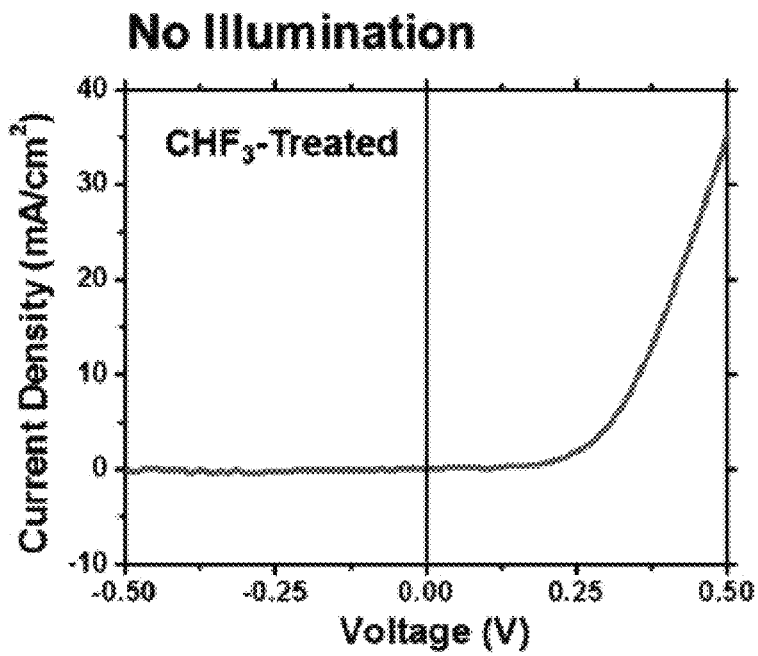
FIGS. 14A and 14B are graphs showing the J-V characteristics measured without illumination of a plasma-treated device and an untreated control device, respectively.
Figure 14B:
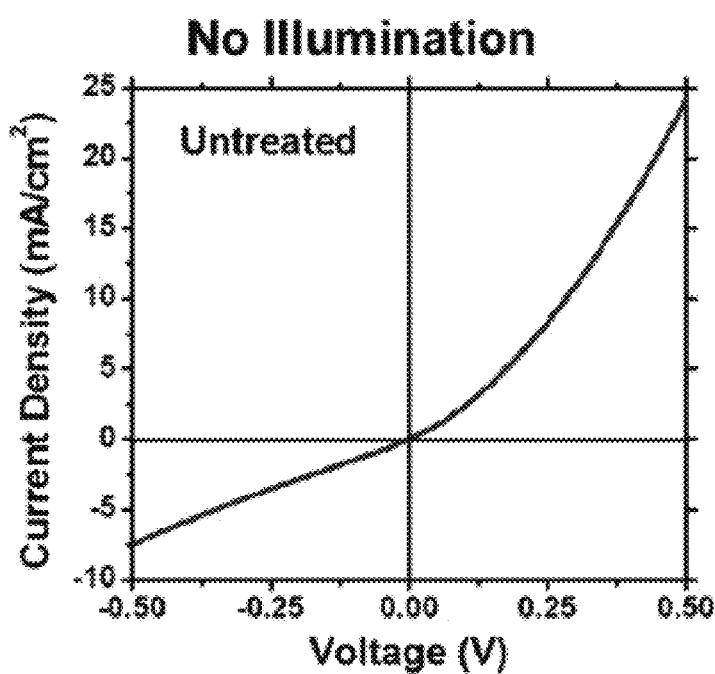
Figure 14C:
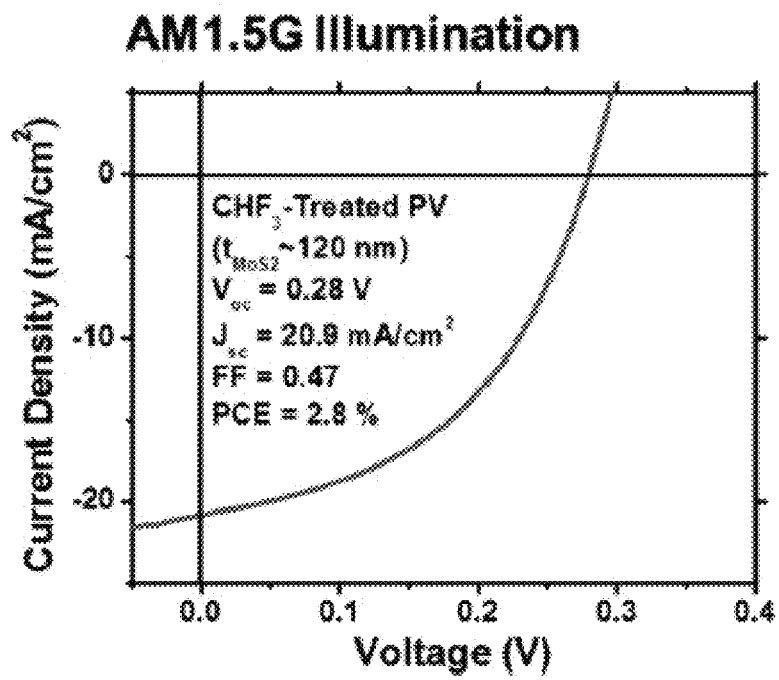
FIGS. 14C and 14D are graphs showing the J-V characteristics measured with illumination of a plasma-treated device and an untreated control device, respectively.
Figure 14D:
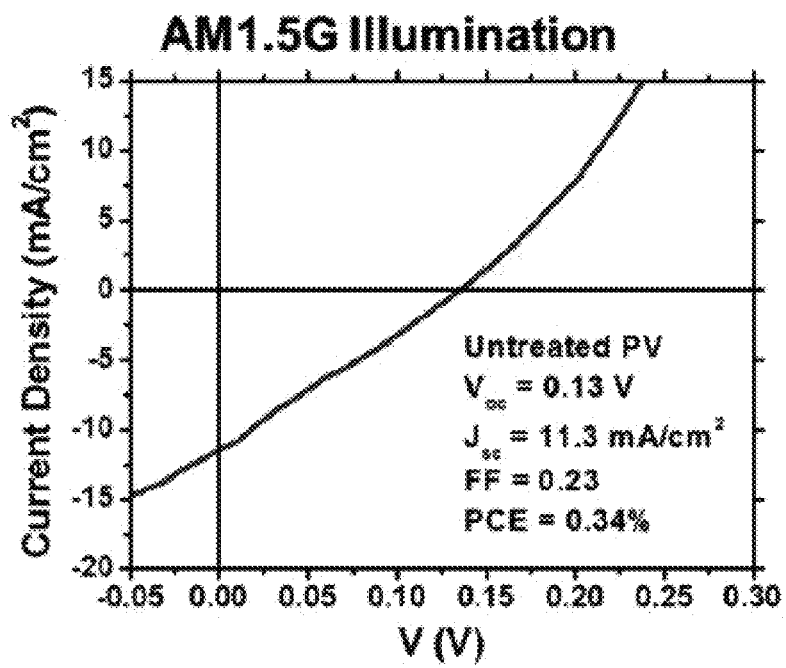

FIGS. 14A and 14B show the J-V characteristics, measured without illumination, of a CHF$_3$ plasma-treated PV device and an untreated control device. Both devices have the same MoS$_2$ layer thickness of 120 nm. In comparison with the untreated device, the plasma-treated PV device exhibits a much more prominent diode-like behavior with a high degree of current rectification (forward/reverse current ratio, I$_F$/I$_R$>10$^4$ at |V|=0.5 V), very small reverse dark current (on the order of 1 pA/cm$^2$), and relatively high shunt resistance of ~790 Ωcm$^2$. The untreated control device exhibits a quite weak degree of rectification (I$_F$/I$_R$~3 at |V|=0.5 V), which is attributed to the shallow Schottky barrier formed at the pristine MoS$_2$/Au interface. FIGS. 14C and 14D show the J-V characteristics of these two devices measured under illumination of AM1.5G simulated sunlight (power density, P$_{sun}$=100 mW/cm$^2$). The untreated PV device exhibits a reasonably high J$_{sc}$ value of 11.3 mA/cm$^2$ that is attributed to the high light absorption coefficient of MoS$_2$, but relatively poor values of V$_{oc}$ (0.13 V), FF (0.23), and PCE (0.34%). Here, PCE=J$_{sc}$V$_{SC}$FF/P$_{sun}$. In contrast, the plasma-treated PV device exhibits a significantly improved PV response with (or as evidenced by) J$_{sc}$=20.9 mA/cm$^2$, V$_{oc}$=0.28 V, FF=0.47, and PCE=2.8%. Especially, this J$_{sc}$ value is comparable with the J$_{sc}$ data of some superb thin-film solar cells based on single-crystal semiconductors. For this specific example, the CHF$_3$ plasma treatment process results in approximately 2-fold increase in J$_{sc}$, 2-fold increase in V$_{oc}$, 2-fold increase in FF, and about 8-fold increase in PCE.

To verify the high J$_{sc}$ values observed in the MoS$_2$ PV devices, the EQE spectra of these two PV devices is measured for wavelengths (λ) ranging from 300 to 800 nm using a luminescence spectrometer (FIG. 15A) (note that the EQE measurements are independent from the PV characterizations under AM1.5G illumination to check the measurement consistency). In this measurement, the EQE at a wavelength λ is extracted from the J$_{sc}$ value measured under the illumination at λ with incident power density P$_λ$ (i.e., EQE (A)=(J$_{sc}$/P$_λ$) (hc/eλ), where h, c, and e are Planck's constant, the speed of light, and the electron charge, respectively). The EQE values of the untreated PV device are in the range of 34%-54% for λ=300 to 700 nm, which are comparable with previously reported EQE data of undoped MoS$_2$ photoactive layers. In comparison to the untreated device, the CHF$_3$ plasma-treated device exhibits significantly enhanced EQE values at all wavelengths between 300 and 700 nm, which are in the range of 37%-78%. FIG. 15B plots the integral of the overlap between these measured EQE values and the standard AM1.5G spectrum over a wavelength range of 300 to 800 nm, which yields calculated J$_{sc}$ values of 18.7 mA/cm$^2$ and 11.2 mA/cm$^2$ for the plasma-treated PV device and the untreated control device, respectively. Such J$_{sc}$ values calculated from EQE data are consistent with the J$_{sc}$ values independently measured using the AM1.5G solar simulator. The remaining small discrepancy between these two groups of J$_{sc}$ values is attributed to the uncounted photocurrent density contributions from other wavelengths that are not covered in our EQE measurements and the EQE-based calculation of J$_{sc}$ values.

Figure 15A:
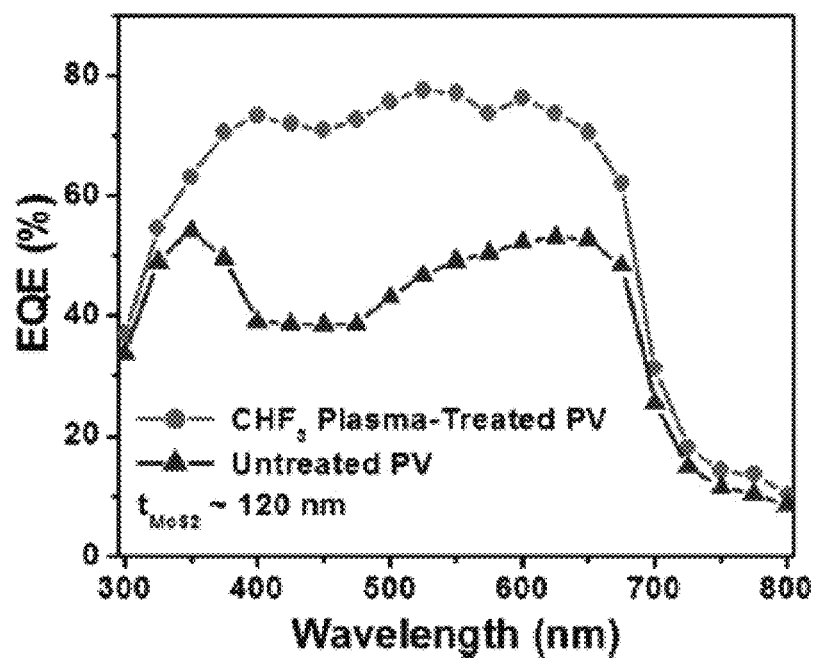
FIG. 15A is a graph plotting EQE measurements for a plasma-treated device and an untreated control device.
Figure 15B:
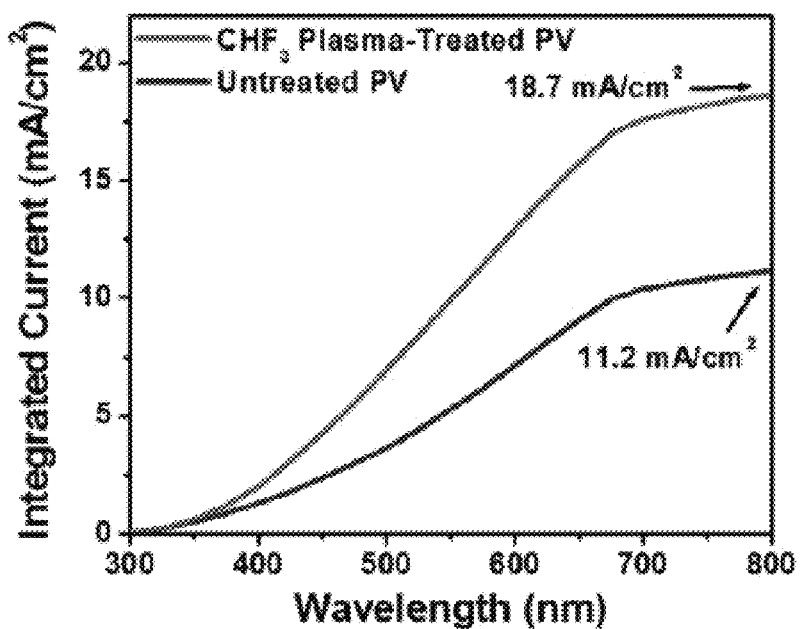
FIG. 15B is a graph plotting the integral of the overlap between the measured EQE values and the standard AM1.5G spectrum.
Figure 16A:
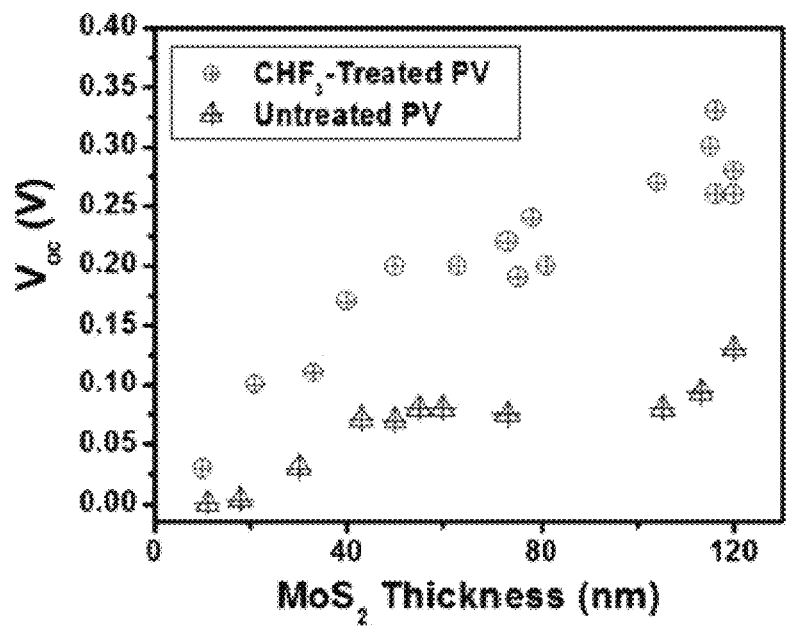
FIGS. 16A-16D are graphs plotting photovoltaic response performance of $V_{oc}$, $J_{sc}$, FF and PCE, respectively, for a plasma-treated device and an untreated control device.
Figure 16B:
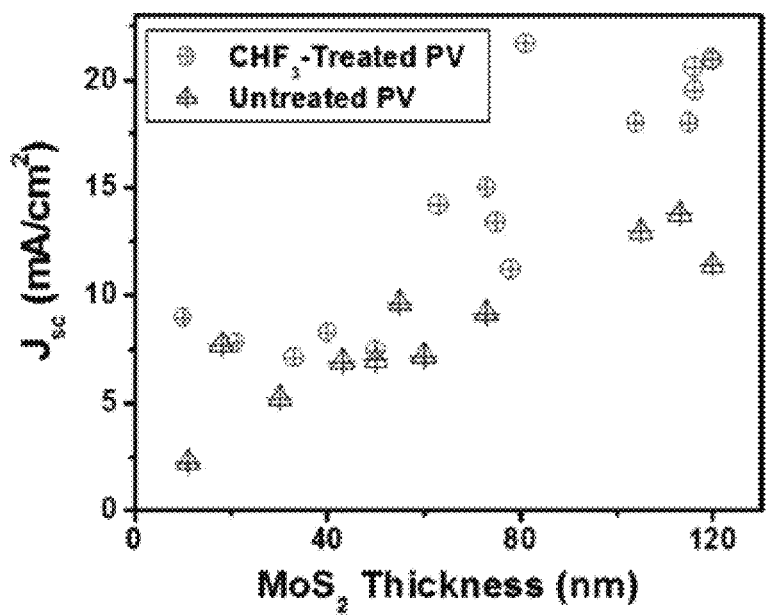
Figure 16C:
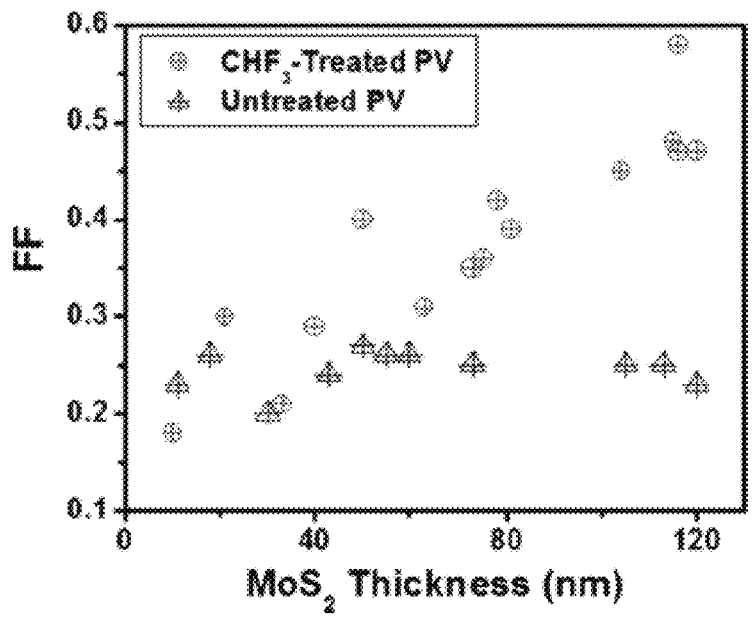
Figure 16D:
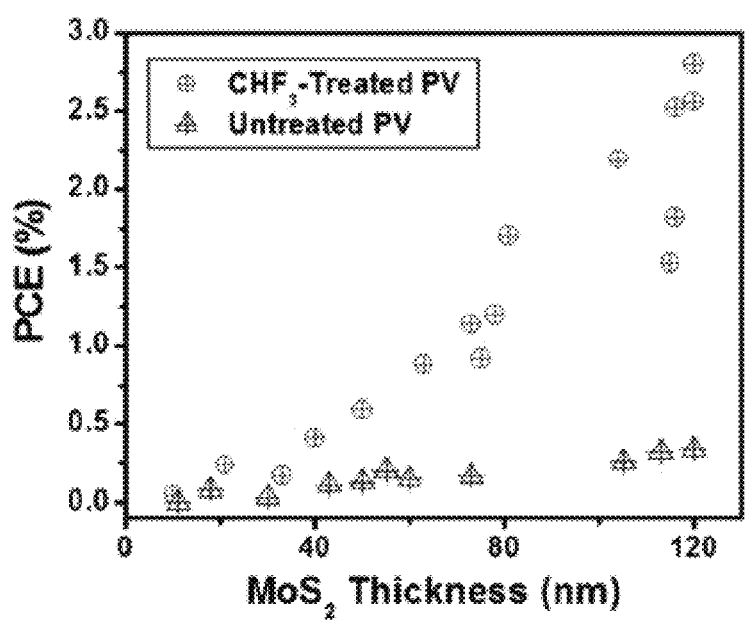

FIG. 15A also demonstrates that the EQE values of both untreated and plasma-treated MoS$_2$ PV devices remain relatively high, even at wavelengths as short as 300 nm (~34% for the untreated device; 37-48% for the plasma-treated ones). Most PV devices based on conventional semiconductors (e.g., Si and III-V compounds) typically exhibit significantly depressed EQE values for λ<400 nm, which is attributed to the blue-response-reduction effect associated with the front surface recombination of photogenerated e-h pairs. Here, the EQE results show that the MoS$_2$ PV devices exhibit a mitigated reduction of the blue response, which could be attributed to the low density of recombination centers on the front surfaces of 2D MoS$_2$ layers (i.e., the surfaces not treated by plasmas). Although such a relatively high blue response is not greatly beneficial for the solar cell applications under AM1.5G condition (the AM1.5G spectrum is significantly cut off at λ<280 nm), it is beneficial for making new blue and ultraviolet (UV) photodetectors.

To further verify the role of plasma treatment in the photovoltaic response enhancement and also identify the effect of MoS$_2$ thickness on PV performance parameters, a set of CHF$_3$ plasma-treated and untreated PV devices with a broad range of MoS$_2$ layer thickness (10 to 120 nm) is fabricated. FIGS. 16A-16D displays (a) V$_{oc}$, (b) J$_{sc}$, (c) FF, and (d) PCE data of all PV devices (red circles are for CHF$_3$ plasma-treated devices; blue triangles are for untreated devices), which are plotted as the functions of MoS$_2$ layer thicknesses. These figures clearly show that plasma-treated PV devices exhibit higher values of V$_{oc}$, J$_{sc}$, FF, and PCE as compared to untreated devices of similar MoS$_2$ thickness. For MoS$_2$ thicknesses above 60 nm, the plasma treatment process induces the more prominent photovoltaic response enhancement. While the current fabrication processes lead to observable device-to-device variation in PV parameters, including the variation among devices of similar MoS$_2$ thickness, the statistical properties of the PV data are highly consistent with the view that the plasma treatment significantly improves the photovoltaic response of MoS$_2$-based PV devices.

FIGS. 16A-16D also show that the PV parameters of CHF$_3$ plasma-treated devices increase with increasing the MoS$_2$ layer thickness in the range of 10 to 120 nm. Devices with MoS$_2$ thicknesses of 80-120 nm exhibit the highest PV response performance (i.e., V$_{oc}$: 0.2-0.33V, J$_{sc}$: 18-21.7 mA/cm$^2$, FF: 0.42-0.58, PCE: 1.7 to 2.8%). The current transfer-printing process is not effective in producing MoS$_2$ flakes thicker than 130 nm. However, using the mechanical exfoliation method previously reported, six CHF$_3$ plasma-treated PV devices with MoS$_2$ thicknesses in the range of 210 to 500 nm are fabricated. These thicker MoS$_2$ PV devices exhibit prominent diode-like J-V characteristics, but they show a very weak PV response (i.e., V$_{oc}$: 0.1-0.15V, J$_{sc}$: 0.62-4.92 mA/cm$^2$, FF: 0.21-0.33, PCE: 0.018 to 0.25%). These results indicate that the performance of plasma-treated MoS$_2$ PV devices highly depends on MoS$_2$ layer thickness, and that the optimal MoS$_2$ thickness, which could result in the highest PCE, should be in the range of 120 to 210 nm.

Figure 17A:
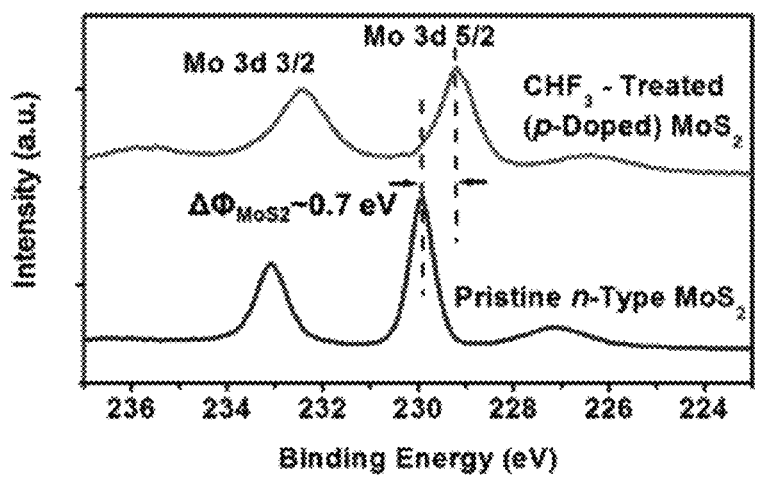
FIG. 17A is a graph depicting X-ray photoelectron spectra surface analysis of plasma-treated surface.

To understand the physical mechanism responsible for the plasma treatment-induced enhancement of current rectification and photovoltaic responses observed in MoS$_2$ PV devices, X-ray photoelectron spectra (XPS) of plasma-treated and untreated MoS$_2$ surfaces were measured. FIG. 17A shows the Mo 3d$_{5/2}$ and Mo 3d$_{3/2}$ XPS peaks of CHF$_3$ plasma-treated and untreated (pristine) MoS$_2$ surfaces. In comparison with the Mo 3d$_{5/2}$ and Mo 3d$_{3/2}$ peaks of the untreated MoS$_2$ surface, the relevant peaks of the CHF$_3$ plasma-treated surface are wider, and their maxima shift toward the lower binding energy values. The relative shift ($\Delta\phi_{MoS2}$) is measured to be about 0.7 eV. Such a downshift of XPS peaks can serve as an indicator of the p-doping in MoS$_2$, because it is corresponding to a relative shift of the Fermi level toward the valence band edge. This XPS characterization also strongly suggests that a p-n junction (i.e., a built-in potential ($\Delta\phi_{in}$)) could be formed in a MoS$_2$ flake with one surface treated with plasma. The CHF$_3$ plasma-induced p-n junction is estimated to have a built-in potential $\Delta\phi_{in} \sim \Delta\phi_{MoS2} \sim 0.7$ eV. Additional in-depth analysis and discussion about physical mechanisms involved in plasma doping processes (e.g., the physical mechanism responsible for plasma-induced p-doping, the depth profiling of dopants, as well as the spatial uniformity of p-n junction built-in potentials) are discussed in the supporting information.

Figure 17B:
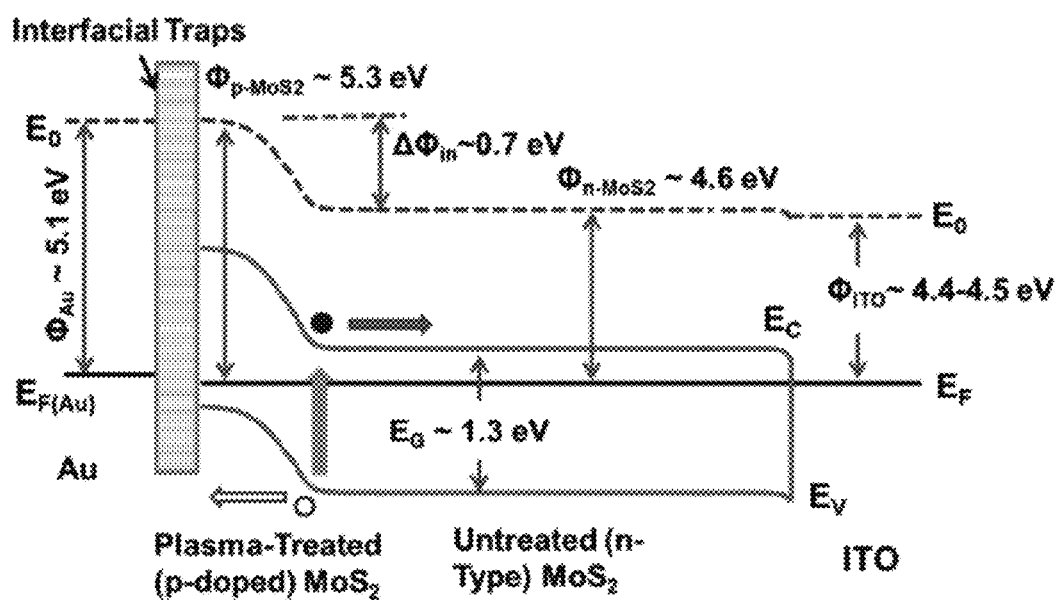
FIG. 17B is a schematic band diagram of a plasma-treated photovoltaic device.

Based on the XPS results, the band diagram of the MoS$_2$ PV devices with vertically stacked ITO/untreated n-type MoS$_2$/CHF$_3$ plasma-treated p-type MoS$_2$/Au regions is plotted as illustrated in FIG. 17B. The interface between plasma-doped and undoped MoS$_2$ regions is expected to be a p-n junction with a built-in potential $\Delta\phi_{in} \sim 0.7$ eV, as implied by the XPS data. The electric field associated with this built-in potential barrier could effectively facilitate the separation and collection of photo-generated e-h pairs, therefore resulting in the higher J$_{sc}$ and EQE values for plasma-doped MoS$_2$ PV devices as compared to those for undoped ones. This built-in potential barrier is also responsible for the increased open-circuit voltage (V$_{oc}$). In addition, the plasma doping-induced p-n junctions can result in a strong diode-like transport characteristic in MoS$_2$ PV devices, which feature a high degree of current rectification. Such a rectifying diode behavior effectively suppresses the reverse dark current and increases the shunt resistance of a MoS$_2$ PV diode, resulting in the enhancement of the fill factor (FF).

Although the plasma-induced enhancement of photovoltaic response in MoS$_2$ PV devices could be attributed to the formation of p-n junctions in MoS$_2$ photoactive layers, the effect of the Schottky junction barriers potentially formed at ITO/MoS$_2$ and Au/MoS$_2$ interfaces needs to be further analyzed and justified. The interface between ITO and untreated n-type MoS$_2$ is expected to be a quasi-Ohmic contact, because the work function of untreated MoS$_2$ ($\phi_{n-MoS2} \sim 4.6$ eV) is very close to that of ITO ($\phi_{ITO} \sim 4.4$-4.5 eV). Therefore, only a negligible Schottky barrier built-in potential would be formed at ITO/untreated MoS$_2$ interfaces. The built-in potential ($\Delta\phi_{in}$) of the Schottky barrier at such an Au/untreated MoS$_2$ interface is ideally estimated to be $\Delta\phi_{in} = \phi_{Au} - \phi_{n-MoS2} \sim 0.5$ eV. Shanmugam et al. attributed the photovoltaic response observed in their MoS$_2$ PV devices to such a Schottky barrier effect. The photovoltaic response observed in our undoped PV devices could also be attributed to it. However, the substantially poorer PV performance of our undoped PV devices in comparison with the plasma-doped ones suggests that the real Schottky barrier height in the undoped PV devices may be significantly smaller than 0.5 eV (i.e., $\phi_{Au} - \phi_{n-MoS2}$), which could be attributed to the Fermi level pinning effect induced by the interfacial traps at Au/pristine MoS$_2$ interfaces. It is also postulated that the real Au/MoS$_2$ Schottky barrier heights may highly depend on the specific conditions for producing and processing MoS$_2$ flakes.

Based on the XPS result, the work function of CHF$_3$ plasma-treated (or p-doped) MoS$_2$ layers is estimated to be $\phi_{p-MoS2} \sim 5.3$ eV that is close to the work function of Au (i.e., $\phi_{Au} \sim 5.1$ eV). Therefore, an Au/p-doped MoS$_2$ interface would be likely a quasi-Ohmic contact with a very shallow Schottky barrier. However, the band alignment at such Au/p-doped MoS$_2$ interfaces could be complicatedly affected by the interfacial traps, as illustrated in FIG. 17B.

Figure 18:
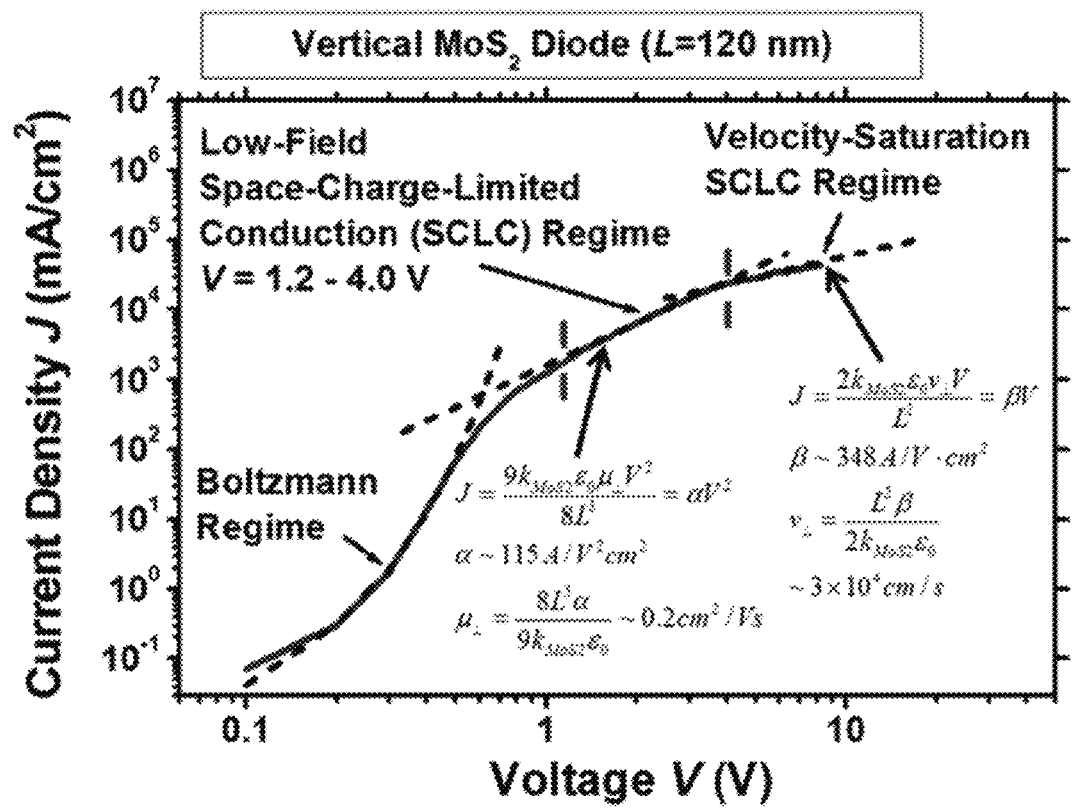
FIG. 18 is a graph showing the forward bias J-V characteristic curve of a photovoltaic device measured without illumination.

It is known that in layered semiconductors, the interlayer transport characteristic parameters (e.g., mobility and saturation velocity) are worse than the corresponding parameters for the in-plane transport case. To evaluate the interlayer transport properties in multilayer MoS$_2$, we further studied the diode transport characteristics of our PV devices in different bias regimes. FIG. 18 shows the forward bias J-V characteristic curve, measured without illumination, of a PV diode consisting of vertically stacked Au/p-doped MoS$_2$/n-type MoS$_2$/ITO layers. The total MoS$_2$ thickness (or the channel length of this vertical diode) is L $\sim$120 nm. This vertical MoS$_2$ diode exhibits different transport characteristics in different bias regimes, including Boltzmann (V=0-1.2 V), low-field space-charge-limited conduction (SCLC) (V=1.2-4 V), and velocity-saturation SCLC (V>4V) regimes. Especially, in the low-field SCLC regime, the J-V curve can be well fitted with Equation (3) (i.e., the Mott-Gurney equation for the low-field SCLC regime),[34,35] where k$_{MoS2}$ is the effective dielectric constant of multilayer MoS$_2$ (k$_{MoS2} \sim 10$);[36,37] $\in_0$ is the vacuum permittivity; $\mu_\perp$ is the field-effect mobility along the direction perpendicular to MoS$_2$ layers. Here, the coefficient $\alpha = 9k_{MoS2}\in_0\mu_\perp/8L^3$ is fitted to be $\sim$115 A/V$^2$ cm$^2$, and $\mu_\perp = 8L^3\alpha/9k_{MoS2}\in_0$ is estimated to be 0.2 cm$^2$/Vs that is about two orders of magnitude lower than typical in-plane mobility ($\mu_{//}$) values of MoS$_2$ layers.

$$J = \frac{9k_{MoS2}\varepsilon_0\mu_\perp V^2}{8L^3} = \alpha V^2 \qquad (3)$$

$$J = \frac{2k_{MoS2}\varepsilon_0 v_\perp V}{L^2} = \beta V \qquad (4)$$

In the velocity-saturation SCLC regime, the J-V curve can be fitted with Equation (4) (i.e., the Mott-Gurney equation for the velocity-saturation SCLC regime), where $v_\perp$ is the saturation velocity along the direction perpendicular to MoS$_2$ layers. The coefficient $\beta = 2k_{MoS2}\in_0 v_\perp/L$ is fitted to be $\sim$348

A/Vcm$^2$, and $v_\perp$ is estimated to be ~$3\times10^4$ cm/s that is also about two orders of magnitude lower than the in-plane saturation velocity in MoS$_2$ layers. In addition, the critical electric field associated with $v_\perp$ is ~$3\times10^5$ V/cm that is estimated from the critical voltage (~4V) of the transition between low-field and velocity-saturation SCLC regimes.

A comprehensive model may be developed to fully understanding the MoS$_2$ thickness-dependent behaviors of critical PV. Such a model should be based on the plasma doping-modulated band structure of MoS$_2$ and needs comprehensive data of diffusion lengths and binding energies of photo-generated e-h pairs, positions/depths of p-n junction depletion regions, electric field-dependent recombination rates of carriers, and light extinction coefficients in plasma-doped multilayer MoS$_2$. An initial qualitative explanation is provided. The increase of $J_{sc}$ with increasing the MoS$_2$ thickness in the range of 10-120 nm could be attributed to the increase of the total absorption of incident light and the total amount of photo-generated carriers. The low $J_{sc}$ values observed in devices with MoS$_2$ thicknesses >210 nm may be due to the limited diffusion lengths of photo-generated carriers that in turn would result in a low collection efficiency of carriers at the electrodes. Although the origins of $V_{oc}$ and FF parameters of MoS$_2$ PV devices are still not clear, the previous works on c-Si, a-Si, and organic PV cells imply that they are probably associated with multiple factors, including built-in potentials ($\Delta\phi_{in}$) at p-n junctions, shunt resistance ($R_{sh}$), series resistance ($R_s$), generation rate of carriers per unit photoactive area (G), disorder, temperature (T), and the work functions of electrodes.[39-41] Here, $R_{sh}$, $R_s$, G values are dependent on the MoS$_2$ thickness. The increase of MoS$_2$ thickness in the range of 10-120 nm can enhance the absorption of incident light and the generation rate of carriers (G), which could increase the quasi-Fermi level difference between electrons and holes, and therefore increase $V_{oc}$. This mechanism is expected to be coupled with an increase of $J_{sc}$. In addition, the increase of MoS$_2$ thickness is expected to reduce the current leakage through the tunneling channels and pin-holes in MoS$_2$ flakes, which could increase $R_{sh}$ and therefore $V_{oc}$ as well as FF values. However, when the MoS$_2$ thickness is overly thick (e.g., $t_{MoS2}$~210 nm), $R_s$ may be too high and degrade the FF value.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A method for fabricating a semiconductor device having a p-n junction, comprising:
    forming one or more protrusions on a top surface of an ingot using photolithographic techniques, where the ingot is comprised of a multi-layer structure of atomically thin two-dimensional sheets;
    doping the one or more protrusions by applying a plasma thereto; and
    exfoliating layers of a given protrusion from the top surface of the ingot by pressing the top surface of the ingot against a planar surface of a bottom electrode.

2. The method of claim 1, wherein forming one or more protrusions further comprises
    applying a photoresist layer on the top surface of the ingot;
    depositing a metal mask onto the top surface of the ingot;
    plasma etching the top surface of the ingot to form the one or more protrusions; and
    removing the metal mask from the one or more protrusions.

3. The method of claim 1, wherein doping the top surface of the ingot further comprises applying a plasma using reactive ion etching, where the plasma contains one of oxygen or fluoride.

4. The method of claim 1, wherein each sheet of the multi-layer structure of atomically thin sheets is comprised of a transition metal dichaelcogenide.

5. The method of claim 4, wherein the transition metal dichalcogenide material has a larger concentration of electrons than holes and the step of doping occurs prior to the step of exfoliating.

6. The method of claim 1, further comprises forming a top electrode of the semiconductor device by depositing a transparent material onto the exfoliated layers of the given protrusion.

7. The method of claim 6, wherein the transparent material is further defined as indium tin oxide.

8. The method of claim 1, wherein the bottom electrode is a metal selected from the group of aluminum, gold and platinum.

9. A method for fabricating a photovoltaic device, comprising:
- forming one or more protrusions on a top surface of an ingot using photolithographic techniques, where the ingot is a multi-layer structure of atomically-thin two-dimensional sheets and each sheet is comprised of a transition metal dichalcogenide;
- doping the one or more protrusions by applying a plasma to the protrusions using reactive ion etching, where the plasma contains one of oxygen or fluoride;
- exfoliating layers of a given protrusion from the top surface of the ingot by pressing the top surface of the ingot against a planar surface of a bottom electrode; and
- depositing a top electrode onto the exfoliated layers of the given protrusion, where the top electrode is comprised of a transparent material.

* * * * *